US012688878B2

(12) United States Patent

Cho et al.

(10) Patent No.: US 12,688,878 B2

(45) Date of Patent: Jul. 21, 2026

(54) SEMICONDUCTOR DEVICE

(71) Applicant: SK hynix Inc., Icheon-si (KR)

(72) Inventors: Kyung Jun Cho, Icheon-si (KR); Jae Hyung Park, Icheon-si (KR); Jae Seung Lee, Icheon-si (KR); Su Hyun Oh, Icheon-si (KR); Jin Hyung Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 89 days.

(21) Appl. No.: 18/922,931

(22) Filed: Oct. 22, 2024

(65) Prior Publication Data

US 2025/0372134 A1 Dec. 4, 2025

(30) Foreign Application Priority Data

May 30, 2024 (KR) ........................ 10-2024-0071134

(51) Int. Cl.
*G11C 7/22* (2006.01)

(52) U.S. Cl.
CPC .................................... *G11C 7/222* (2013.01)

(58) Field of Classification Search
CPC ........... G06F 12/0893; G06F 2212/305; G06F 15/7803
See application file for complete search history.

(56) References Cited

U.S. PATENT DOCUMENTS

| | | | | |
|---|---|---|---|---|
| 9,748,956 B2 * | 8/2017 | Lee | ...................... | G11C 29/028 |
| 9,753,521 B2 * | 9/2017 | Ware | ................... | G11C 11/4096 |
| 10,185,652 B2 * | 1/2019 | Narui | ........................ | G11C 5/04 |
| 2013/0038380 A1 | 2/2013 | Cordero et al. | | |

FOREIGN PATENT DOCUMENTS

| | | |
|---|---|---|
| KR | 1020130011355 A | 1/2013 |
| KR | 1020190114444 A | 10/2019 |

* cited by examiner

*Primary Examiner* — Han Yang
*Assistant Examiner* — Christopher Lane Reece
(74) *Attorney, Agent, or Firm* — WILLIAM PARK AND ASSOCIATES LTD.

(57) ABSTRACT

A semiconductor device includes a base chip configured to output a strobe signal and a control signal and to output a first update signal and a second update signal in response to receiving first and second core strobe signals, a first core chip configured to generate the first core strobe signal by delaying the strobe signal by a first delay amount while a pulse of the control signal is input, to output the first core strobe signal to the base chip, and to calibrate the first delay amount while the first update signal is enabled, and a second core chip configured to generate the second core strobe signal by delaying the strobe signal by a second delay amount when a pulse of the control signal is input, to output the second core strobe signal to the base chip, and to calibrate the second delay amount while the second update signal is enabled.

32 Claims, 21 Drawing Sheets

Figure 9:
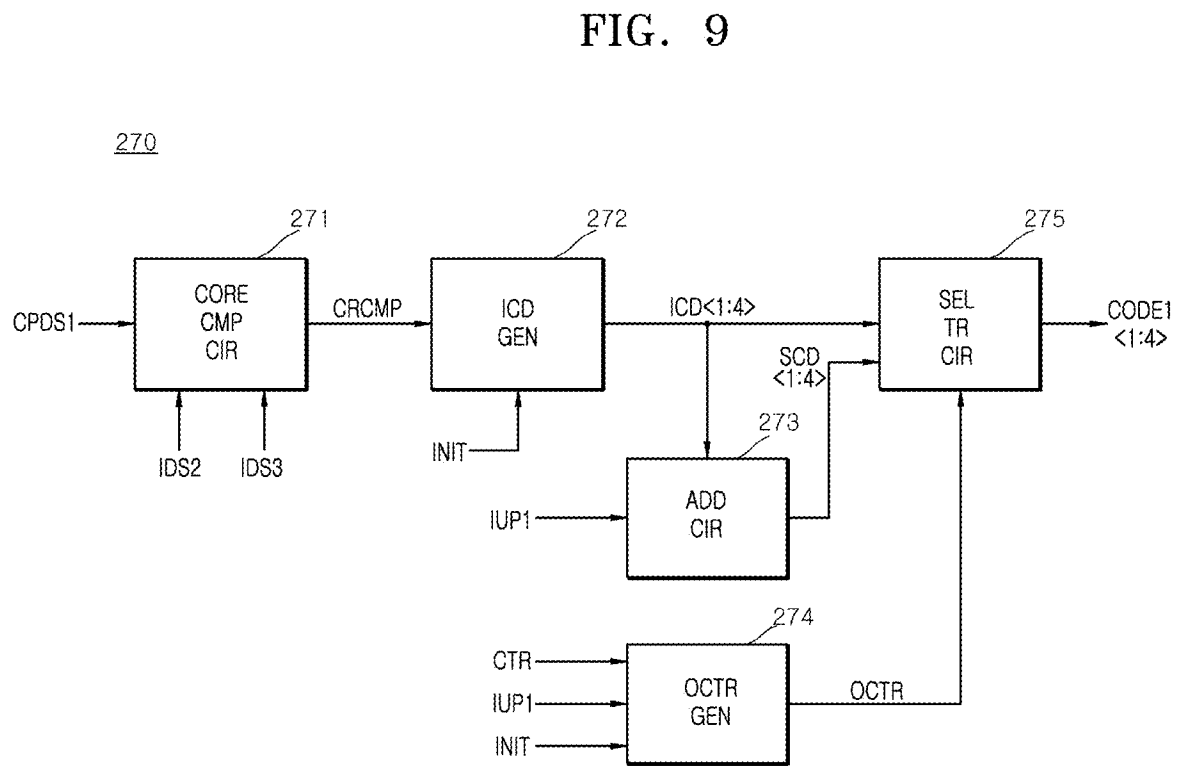

CPDS1 → CORE CMP CIR (271)
IDS2 → CORE CMP CIR
IDS3 → CORE CMP CIR

CORE CMP CIR → CRCMP → ICD GEN (272)
INIT → ICD GEN

ICD GEN → ICD<1:4> → SEL TR CIR (275)

ICD<1:4> → ADD CIR (273)
IUP1 → ADD CIR
ADD CIR → SCD <1:4> → SEL TR CIR

SEL TR CIR → CODE1 <1:4>

OCTR GEN (274)
CTR → OCTR GEN
IUP1 → OCTR GEN
INIT → OCTR GEN
OCTR GEN → OCTR → SEL TR CIR

SEMICONDUCTOR DEVICE

CROSS-REFERENCE TO RELATED APPLICATION

The present application claims priority under 35 U.S.C. § 119(a) to Korean Patent Application No. 10-2024-0071134, filed in the Korean Intellectual Property Office on May 30, 2024, the entire contents of which application is incorporated herein by reference.

BACKGROUND

1. Technical Field

The present disclosure relates to a semiconductor device having a plurality of core chips, including but not limited to strobe signals for the plurality of core chips.

2. Related Art

As technology for manufacturing a semiconductor device is developed, packaging technology for a plurality of core chips utilized in the semiconductor device accomplishes high integration and high performance. Packaging technologies for semiconductor devices vary relating to three-dimensional structures in which a plurality of core chips is vertically stacked and relating to two-dimensional structures in which a plurality of core chips is disposed flat on a printed circuit board (PCB). For example, semiconductor devices having a three-dimensional structure include a plurality of core chips stacked and interconnected using through silicon vias (TSV), also referred to as "through electrodes" or a plurality of core chips stacked and interconnected using wire bonding, such as high bandwidth memory (HBM).

In general, access to a core chip is often performed through a controller. For example, when the data of the core chip are read, a host transmits a read command and an address to the controller, and the controller transmits data to the host after reading the data from the core chip. When the data of the core chip are written, the host transmits a write command, write data, and an address to the controller, and the controller writes the write data into a memory device. During such an access process for the core chip, strobe signals that strobe data that are input to and output from a plurality of core chips are generated at different time due to a process, voltage, and temperature (PVT) variation.

SUMMARY

In an embodiment, a semiconductor device may include a base chip configured to output a strobe signal and a control signal and configured to output a first update signal and a second update signal in response to receiving a first core strobe signal and a second core strobe signal, a first core chip configured to generate the first core strobe signal by delaying the strobe signal by a first delay amount when a pulse of the control signal is input, configured to output the first core strobe signal to the base chip, and configured to calibrate the first delay amount while the first update signal is enabled, and a second core chip configured to generate the second core strobe signal by delaying the strobe signal by a second delay amount when a pulse of the control signal is input, configured to output the second core strobe signal to the base chip, and configured to calibrate the second delay amount while the second update signal is enabled.

In an embodiment, a semiconductor device may include a base chip configured to output a strobe signal and a control signal and configured to output an update signal in response to detecting a phase of a core strobe signal, and a core chip configured to generate the core strobe signal by delaying the strobe signal by a delay amount based on a code signal when a first pulse of the control signal is enabled, configured to output the core strobe signal to the base chip when a second pulse of the control signal is enabled, and configured to calibrate the delay amount by incrementing bits of the code signal when a third pulse of the control signal and the update signal are enabled.

In an embodiment, a strobe signal training method may include initializing a code signal of a core chip after the start of a first training operation, outputting, by a base chip, a strobe signal and a control signal after the start of the first training operation; outputting, by the core chip after a start of a second training operation, a core strobe signal generated by delaying the strobe signal by a delay amount based on the code signal to the base chip and generating, by the base chip, an update signal by comparing a phase of the core strobe signal with a phase of a reference strobe signal generated from the strobe signal; and outputting, by the base chip after a start of a third training operation, the update signal to the core chip and calibrating, by the core chip, the delay amount by incrementing bits of the code signal while the update signal is enabled.

BRIEF DESCRIPTION OF THE DRAWINGS

FIG. 4 is a timing diagram during operation of a calibration control circuit according to an embodiment of the present disclosure.

FIG. 9 is a block diagram illustrating an embodiment of a first core calibration circuit included in a first core chip according to an embodiment of the present disclosure.

FIG. 11 is a circuit diagram illustrating an embodiment of a logic circuit included in a first output control signal generation circuit according to the present disclosure.

FIG. 12 is a block diagram illustrating an embodiment of a second core chip included in a semiconductor device according to the present disclosure.

FIG. 13 is a block diagram illustrating an embodiment of a third core chip included in a semiconductor device according to the present disclosure.

FIG. 20 and FIG. 21 are diagrams illustrating an embodiment of a stack memory system for a semiconductor device according to the present disclosure.

DETAILED DESCRIPTION

Terms such as "vertically," "below," "under," "over," "on," "side," "higher," "level," and other terms implying relative spatial relationship or orientation are utilized only for the purpose of ease of description or reference to a drawing and are not otherwise limiting. Terms such as "substantially similar" or "substantially the same" indicate values within typical engineering tolerances in the industry.

Terms such as "first" and "second" are used to distinguish between various elements and do not imply size, order, priority, quantity, or importance of the elements. For example, a first element may be referred to as a second element in one example, and the second element may be referred to as a first element in another example.

When one element is identified as "connected" to another element, the elements may be connected directly or through an intervening element between the elements. When two elements are identified as "directly connected," one element is directly connected to the other element without an intervening element between the two elements.

A "logic high level" and a "logic low level" are used to describe the logic levels of signals. A signal at a "logic high level" is distinguished from a signal at a "logic low level." For example, when a signal at a first voltage corresponds to a signal at a logic high level, a signal at a second voltage corresponds to a signal at a logic low level. According to an embodiment, a logic high level is a voltage higher than a logic low level. According to an embodiment, the logic levels of signals are at different logic levels or opposite logic levels. For example, a signal at a logic high level is at a logic low level in some embodiments, and a signal having a logic low level is at a logic high level in other embodiments.

Embodiments of the present disclosure are described in detail with reference to the accompanying drawings. Specific structural or functional descriptions of embodiments are provided as examples to describe concepts that are disclosed in the present application. Examples or embodiments in accordance with the concepts may be carried out in various forms, and the scope of the present disclosure is not limited to the examples or embodiments described in this specification.

The present disclosure describes a semiconductor device that performs a training operation to calibrate the delay amount for a strobe signal used in a plurality of core chips.

The training operation adjusts timing for generation of strobe signals to be aligned with each other.

Figure 1:
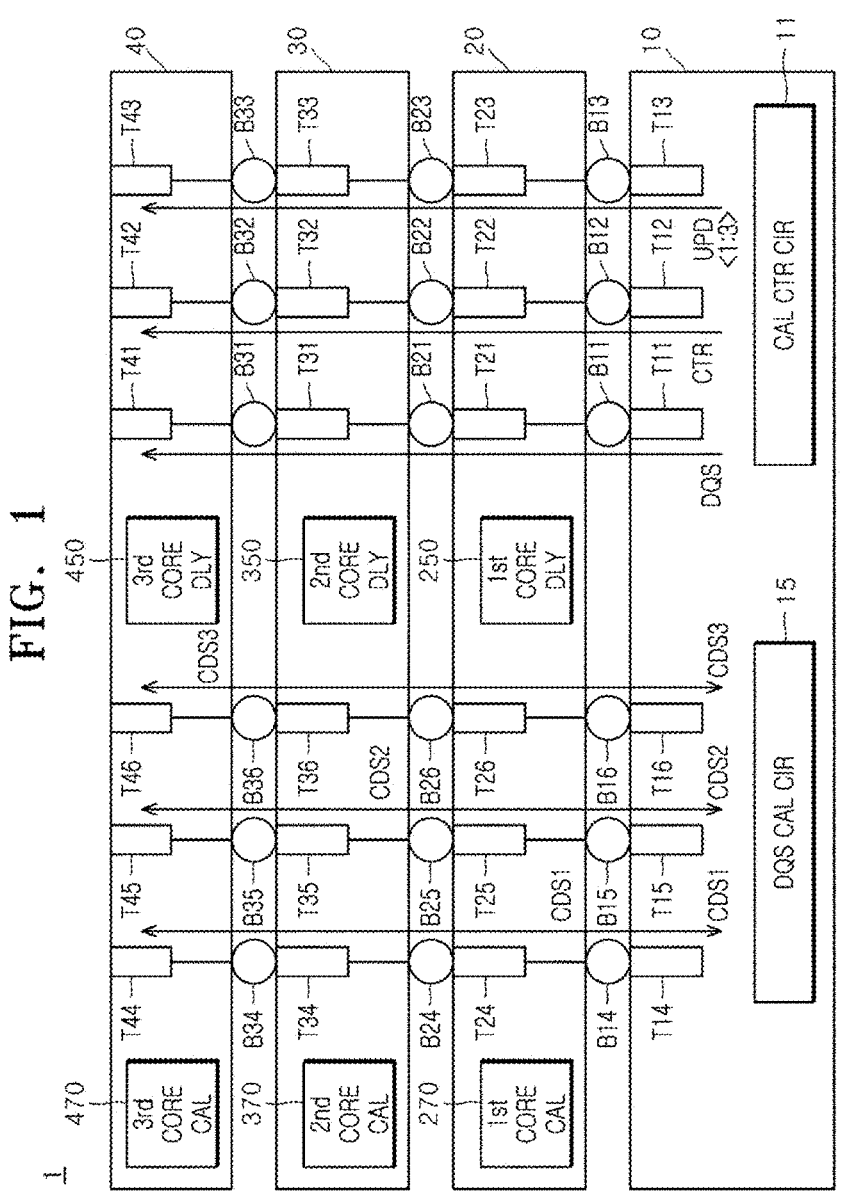
FIG. 1 is a block diagram illustrating a semiconductor device according to an embodiment of the present disclosure.

As illustrated in FIG. 1, a semiconductor device 1 according to an embodiment of the present disclosure includes a base chip 10, a first core chip 20, a second core chip 30, and a third core chip 40.

The base chip 10 is electrically connected to first to sixth signal paths. The first signal path electrically connects through electrodes T11, T21, T31, and T41 alternated with bumps B11, B21, and B31. The second signal path electrically connects through electrodes T12, T22, T32, and T42 alternated with bumps B12, B22, and B32. The third signal path electrically connects through electrodes T13, T23, T33, and T43 alternated with bumps B13, B23, and B33. The fourth signal path electrically connects through electrodes T14, T24, T34, and T44 alternated with bumps B14, B24, and B34. The fifth signal path electrically connects through electrodes T15, T25, T35, and T45 alternated with bumps B15, B25, and B35. The sixth signal path electrically connects through electrodes T16, T26, T36, and T46 alternated with bumps B16, B26, and B36. The bumps may include solder balls or other connection structures.

The through electrodes T11, T21, T31, T41, T12, T22, T32, T42, T13, T23, T33, T43, T14, T24, T34, T44, T15, T25, T35, T45, T16, T26, T36, and T46 may each have a cylindrical shape, and each through electrode is made of a conductive material vertically stacked in the corresponding base chip 10, the first core chip 20, the second core chip 30, or the third core chip 40. The bumps B11, B21, B31, B12, B22, B32, B13, B23, B33, B14, B24, B34, B15, B25, B35, B16, B26, and B36 may have a ball shape, and each bump is made of a conductive material for direct connection, for example, to a circuit board.

In an embodiment, the base chip 10 includes the through electrodes T11, T12, T13, T14, T15, and T16, a calibration control circuit (CAL CTR CIR) 11, and a strobe signal calibration circuit (DQS CAL CIR) 15.

The through electrode T11 is electrically connected to the bump B11. The through electrode T12 is electrically connected to the bump B12. The through electrode T13 is electrically connected to the bump B13. The through electrode T14 is electrically connected to the bump B14. The through electrode T15 is electrically connected to the bump B15. The through electrode T16 is electrically connected to the bump B16.

Figure 2:
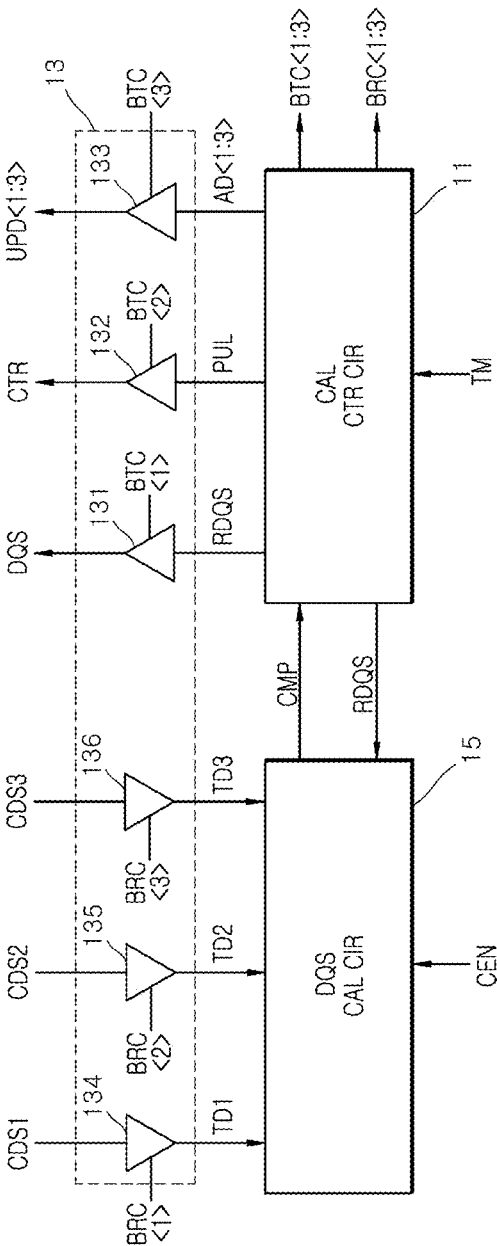
FIG. 2 is a block diagram illustrating an embodiment of a base chip included in a semiconductor device according to the present disclosure.

After the start of each of a first training operation, a second training operation, and a third training operation, the calibration control circuit 11 generates a reference strobe signal that is periodically toggled, for example, RDQS in FIG. 2, that generates a strobe signal DQS when a test mode signal, for example, TM in FIG. 2, is enabled. After the start of each of the first training operation, the second training operation, and the third training operation, the calibration control circuit 11 generates three pulses of a pulse signal, for example, PUL in FIG. 2, that generates three pulses of a control signal CTR when the test mode signal, for example, TM in FIG. 2, is enabled. After the start of the second training operation, the calibration control circuit 11 generates three addition signals, for example, AD<1:3>CMP in FIG. 2, that generate first to third update signals UPD<1:3> based on a comparison signal, for example, CMP in FIG. 2.

Each of the first to third training operations is an operation that determines the delay amounts for the strobe signal DQS output from the base chip 10 to the first core chip 20, the second core chip 30, and the third core chip 40 to result in a delayed strobe signal aligned in time at each of the core chip 20, 30, 40. The first to third training operations are sequentially performed in this example. The first training operation is performed, for example, when a first pulse of the control signal CTR is output. The second training operation is performed, for example, when a second pulse of the control signal CTR is output. The third training operation is performed, for example, when a third pulse of the control signal CTR is output.

After the start of the second training operation, the strobe signal calibration circuit 15 generates the comparison signal, for example, CMP in FIG. 2, by comparing the phase of a first core strobe signal CDS1, the phase of a second core strobe signal CDS2, and the phase of a third core strobe signal CDS3 with the phase of a reference strobe signal, for example, RDQS in FIG. 2.

The base chip 10 outputs the strobe signal DQS that is periodically toggled, after the start of the first training operation, and outputs the first pulse of the control signal CTR. The base chip 10 generates the strobe signal DQS that is periodically toggled, after the start of the second training operation, and the second pulse of the control signal CTR. After the start of the second training operation, the base chip 10 generates the comparison signal, for example, CMP in FIG. 2, by comparing the phase of the first core strobe signal CDS1, the phase of the second core strobe signal CDS2, and the phase of the third core strobe signal CDS3 with the phase of the reference strobe signal, for example, RDQS in FIG. 2. After the start of the second training operation, the base chip 10 generates the first to third update signals UPD<1:3> based on the comparison signal, for example, CMP in FIG. 2. The base chip 10 generates the third pulse of the control signal CTR after the start of the third training operation. The base chip 10 outputs the first update signal UPD<1> to the first core chip 20 after the start of the third training operation. The base chip 10 outputs the second update signal UPD<2> to the second core chip 30 after the start of the third training operation. The base chip 10 outputs the third update signal UPD<3> to the third core chip 50 after the start of the third training operation. The third signal path illustrated in FIG. 1 is illustrated including the through electrodes T13, T23, T33, and T43 and the bumps B13, B23, and B33 that are electrically connected, but may include three separate signal paths including a signal path along which the first update signal UPD<1> is output, a signal path along which the second update signal UPD<2> is output, and a signal path along which the third update signal UPD<3> is output.

The first core chip 20 is electrically connected to the bumps B11, B12, B13, B14, B15, and B16 and is stacked on or over the base chip 10.

In an embodiment, the first core chip 20 includes the through electrodes T21, T22, T23, T24, T25, and T26, a first core delay control circuit (1$^{st}$ CORE DLY) 250, and a first core calibration circuit (1$^{st}$ CORE CAL) 270.

The through electrode T21 is electrically connected between the bump B11 and the bump B21. The through electrode T22 is electrically connected between the bump B12 and the bump B22. The through electrode T23 is electrically connected between the bump B13 and the bump B23. The through electrode T24 is electrically connected between the bump B14 and the bump B24. The through electrode T25 is electrically connected between the bump B15 and the bump B25. The through electrode T26 is electrically connected between the bump B16 and the bump B26.

Figure 7:
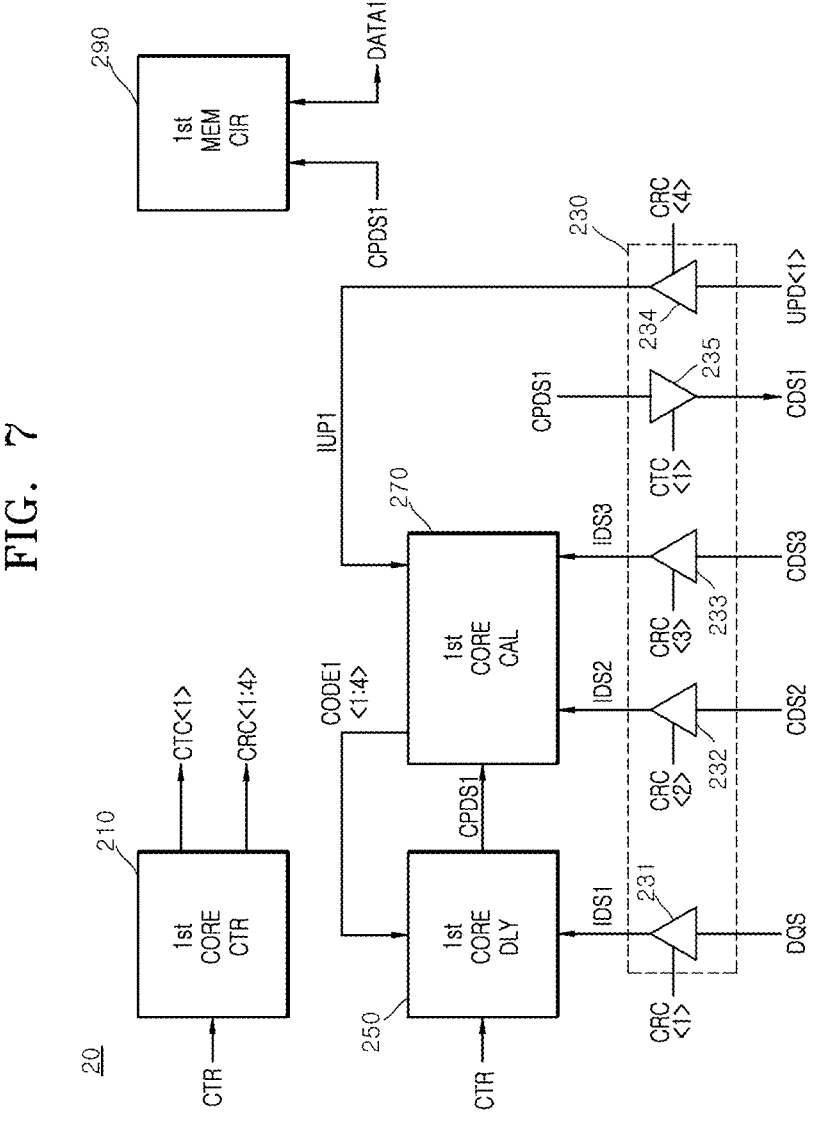
FIG. 7 is a block diagram illustrating an embodiment of a first core chip included in a semiconductor device according to the present disclosure.

The first core delay control circuit 250 receives a first input strobe signal, for example, IDS1 in FIG. 7, generated from the strobe signal DQS. When a pulse of the control signal CTR is input, the first core delay control circuit 250 generates a first comparison strobe signal, for example, CPDS1 in FIG. 7, by delaying the first input strobe signal, for example, IDS1 in FIG. 7, by a first delay amount based on a first code signal, for example, CODE1<1:4> in FIG. 7.

The first core calibration circuit 270 generates the first code signal, for example, CODE1<1:4> in FIG. 7, by comparing the phase of a second input strobe signal, for example, IDS2 in FIG. 7, generated from the second core strobe signal CDS2 output by the second core chip 30 and the phase of a third input strobe signal, for example, IDS3 in FIG. 7, generated from the third core strobe signal CDS3 output by the third core chip 40, with the phase of the first comparison strobe signal, for example, CPDS1 in FIG. 7. The first core calibration circuit 270 increments or sequences through bits of a first code signal, for example, CODE1<1:4> in FIG. 7, when a first input update signal, for example, IUP<1> in FIG. 7, generated from the first update signal UPD<1> is enabled.

The first core calibration circuit 270 according to an embodiment initializes each of the bits of the first code signal, for example, CODE1<1:4> in FIG. 7, at a logic low level. The first core calibration circuit 270 sequentially increments or sequences through the bits of the first code signal, for example, CODE1<1:4> in FIG. 7. The first core calibration circuit 270 sequentially increments or sequences through the bits of the first code signal, for example, CODE1<1:4> in FIG. 7, such as 0000, 0001, 0010, and so forth, until each of the bits of the first code signal is generated at a logic high level, such as 1111. The first core calibration circuit 270 stores the first code signal, for example, CODE1<1:4> in FIG. 7, generated when the first update signal UPD<1> is disabled at a logic low level.

After the start of the first training operation, the first core chip 20 generates the first core strobe signal CDS1 by delaying the strobe signal DQS. After the start of the second training operation, the first core chip 20 generates the first core strobe signal CDS1 by delaying the strobe signal DQS by the first delay amount based on the first code signal, for example, CODE1<1:4> in FIG. 7. After the start of the third training operation, the first core chip 20 incrementing or sequencing through the bits of the first code signal, for example, incrementing CODE1<1:4> from 0000, 0001, 0010, and so forth in FIG. 7, while the first update signal UPD<1> is enabled. The first core chip calibrates the first delay amount based on the first code signal, for example, CODE1<1:4> in FIG. 7 and generates the first core strobe signal CDS1 by delaying the strobe signal DQS by the first delay amount.

The first core chip 20 according to an embodiment initializes each of the bits of the first code signal, for example, CODE1<1:4> in FIG. 7, at a logic low level after the start of the first training operation. After the start of the second training operation, the first core chip 20 sequentially increments the bits of the first code signal, for example, CODE1<1:4> in FIG. 7. After the start of the second training operation, the first core chip 20 generates the first core strobe signal CDS1 by delaying the strobe signal DQS by the first delay amount based on the first code signal, for example, CODE1<1:4> in FIG. 7. After the start of the third training operation, the first core chip 20 stores the first code signal, for example, CODE1<1:4> in FIG. 7, generated when the first update signal UPD<1> is disabled at a logic low level. The first core chip 20 determines the first delay amount based on the first code signal, for example, CODE1<1:4> in FIG. 7, that is stored and generates the first core strobe signal CDS1 by delaying the strobe signal DQS by the first delay amount.

The second core chip 30 is electrically connected to the bumps B21, B22, B23, B24, B25, and B26 and is stacked on or over the first core chip 20.

In an embodiment, the second core chip 30 includes the through electrodes T31, T32, T33, T34, T35, and T36, a second core delay control circuit ($2^{nd}$ CORE DLY) 350, and a second core calibration circuit ($2^{nd}$ CORE CAL) 370.

The through electrode T31 is electrically connected between the bump B21 and the bump B31. The through electrode T32 is electrically connected between the bump B22 and the bump B32. The through electrode T33 is electrically connected between the bump B23 and the bump B33. The through electrode T34 is electrically connected between the bump B24 and the bump B34. The through electrode T35 is electrically connected between the bump B25 and the bump B35. The through electrode T36 is electrically connected between the bump B26 and the bump B36.

Figure 12:
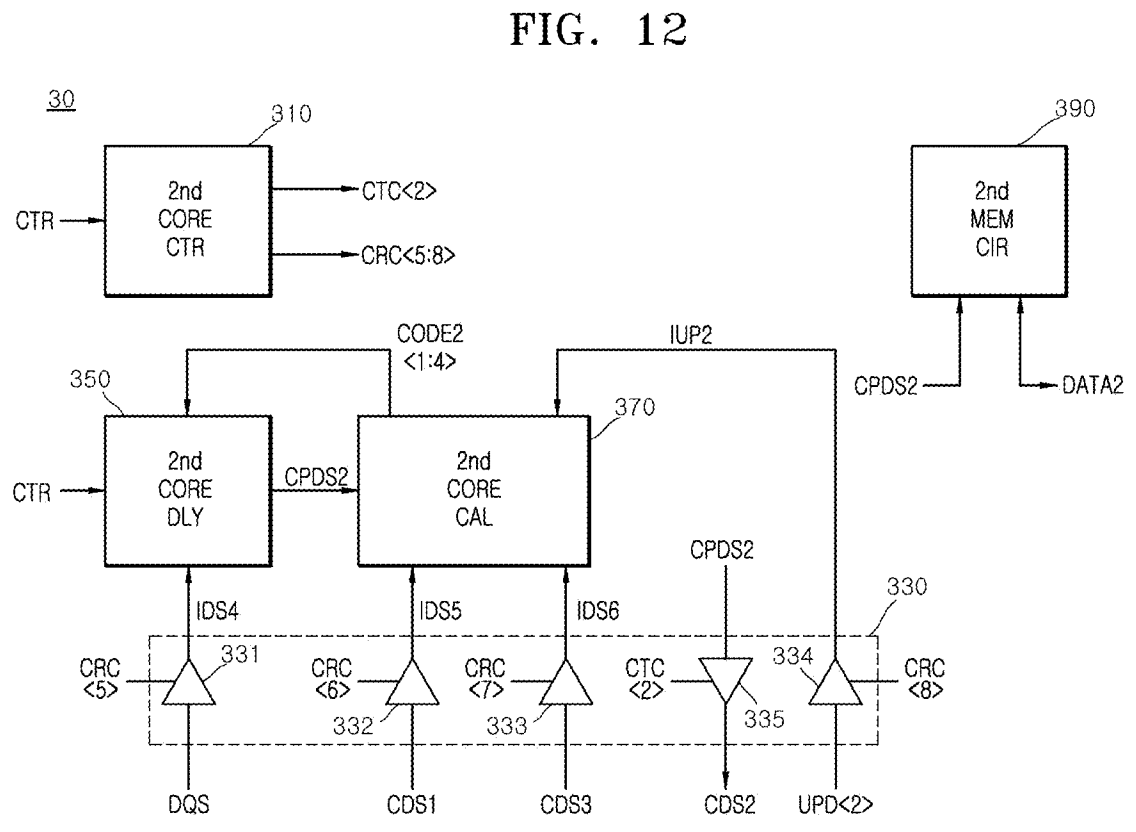

The second core delay control circuit 350 receives a fourth input strobe signal, for example, IDS4 in FIG. 12, generated from the strobe signal DQS. When the pulse of the control signal CTR is input, the second core delay control circuit 350 generates a second comparison strobe signal, for example, CPDS2 in FIG. 12, by delaying the fourth input strobe signal, for example, IDS4 in FIG. 12, by a second delay amount based on a second code signal, for example, CODE2<1:4> in FIG. 12.

The second core calibration circuit 370 generates a second code signal, for example, CODE2<1:4> in FIG. 12, by comparing the phase of a fifth input strobe signal, for example, IDS5 in FIG. 12, generated from the first core strobe signal CDS1 output by the first core chip 20 and the phase of a sixth input strobe signal, for example, IDS6 in FIG. 12, generated from the third core strobe signal CDS3 output by the third core chip 40, with the phase of the second comparison strobe signal, for example, CPDS2 in FIG. 12. The second core calibration circuit 370 increments the bits of a second code signal, for example, CODE2<1:4> in FIG. 12, when a second input update signal, for example, IUP<2> in FIG. 12, generated from the second update signal UPD<2> is enabled.

The second core calibration circuit 370 according to other embodiment initializes each of the bits of the second code signal, for example, CODE2<1:4> in FIG. 12, at a logic low level. The second core calibration circuit 370 sequentially increments the bits of the second code signal, for example, CODE2<1:4> in FIG. 12. The second core calibration circuit 370 sequentially increments the bits of the second code signal, for example, CODE2<1:4> in FIG. 12, until each of the bits of the second code signal is generated at a logic high level. The second core calibration circuit 370 stores the second code signal, for example, CODE2<1:4> in FIG. 12, generated when the second update signal UPD<2> is disabled at a logic low level.

After the start of the first training operation, the second core chip 30 generates the second core strobe signal CDS2 by delaying the strobe signal DQS. After the start of the second training operation, the second core chip 30 generates the second core strobe signal CDS2 by delaying the strobe signal DQS by the second delay amount based on the second code signal, for example, CODE2<1:4> in FIG. 12. After the start of the third training operation, the second core chip 30 increments the bits of the second code signal, for example, CODE2<1:4> in FIG. 12, while the second update signal UPD<2> is enabled. The second core chip 30 calibrates the second delay amount based on the second code signal, for example, CODE2<1:4> in FIG. 12, and generates the second core strobe signal CDS2 by delaying the strobe signal DQS by the second delay amount.

The second core chip 30 according to an embodiment initializes each of the bits of the second code signal, for example, CODE2<1:4> in FIG. 12, at a logic low level after the start of the first training operation. After the start of the second training operation, the second core chip 30 sequentially increments the bits of the second code signal, for example, CODE2<1:4> in FIG. 12. After the start of the second training operation, the second core chip 30 generates the second core strobe signal CDS2 by delaying the strobe signal DQS by the second delay amount based on the second code signal, for example, CODE2<1:4> in FIG. 12. After the start of the third training operation, the second core chip 30 stores the second code signal, for example, CODE2<1:4> in FIG. 12, generated when the second update signal UPD<2> is disabled at a logic low level. The second core chip 30 determines the second delay amount based on the second code signal, for example, CODE2<1:4> in FIG. 12, that is stored and generates the second core strobe signal CDS2 by delaying the strobe signal DQS by the second delay amount.

The third core chip 40 is electrically connected to the bumps B31, B32, B33, B34, B35, and B36 and is stacked on or over the second core chip 30.

In an embodiment, the third core chip 40 includes the through electrodes T41, T42, T43, T44, T45, and T46, a third core delay control circuit ($3^{rd}$ CORE DLY) 450, and a third core calibration circuit ($3^{rd}$ CORE CAL) 470.

The through electrode T41 is electrically connected to the bump B31. The through electrode T42 is electrically connected to the bump B32. The through electrode T43 is electrically connected to the bump B33. The through electrode T44 is electrically connected to the bump B34. The through electrode T45 is electrically connected to the bump B35. The through electrode T46 is electrically connected to the bump B36.

Figure 13:
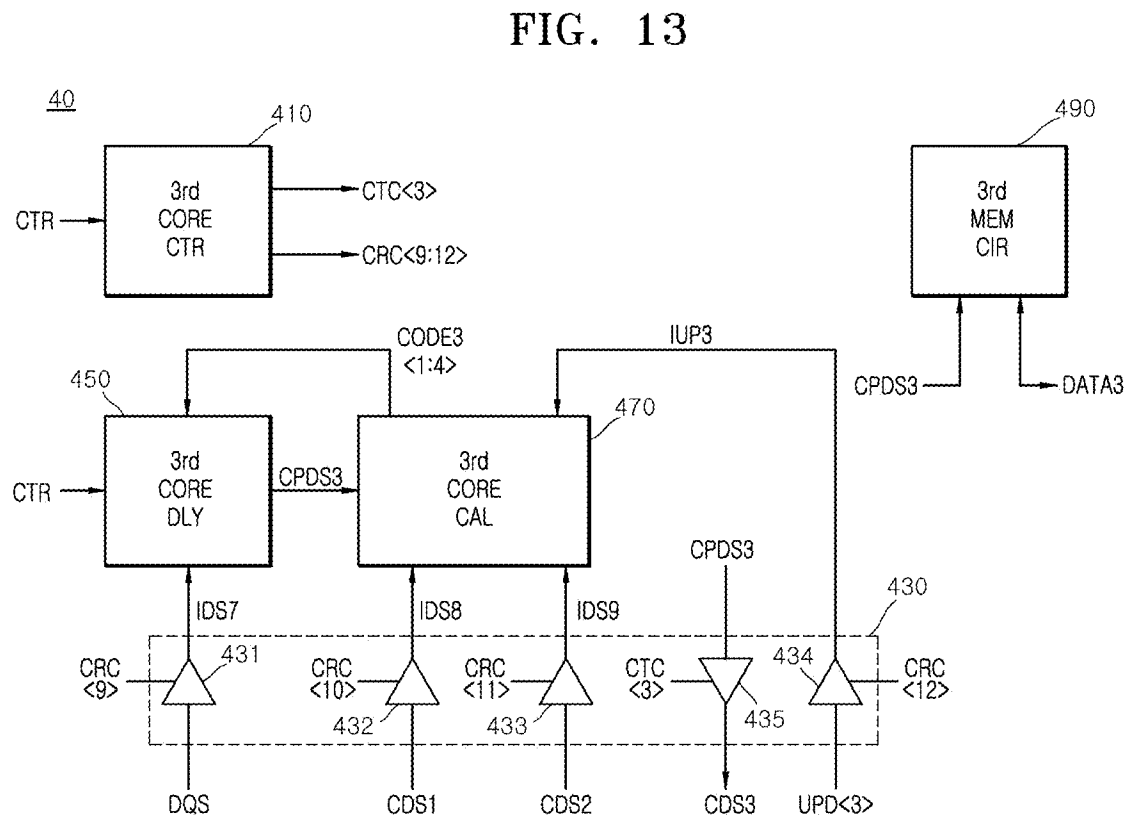

The third core delay control circuit 450 receives a seventh input strobe signal, for example, IDS7 in FIG. 13, generated from the strobe signal DQS. When the pulse of the control signal CTR is input, the third core delay control circuit 450 generates a third comparison strobe signal, for example, CPDS3 in FIG. 13, by delaying the seventh input strobe signal, for example, IDS7 in FIG. 13, by a third delay amount based on a third code signal, for example, CODE3<1:4> in FIG. 13.

The third core calibration circuit 470 generates a third code signal, for example, CODE3<1:4> in FIG. 13, by comparing the phase of an eighth input strobe signal, for example, IDS8 in FIG. 13, generated from the first core strobe signal CDS1 output by the first core chip 20 and the phase of a ninth input strobe signal, for example, IDS9 in FIG. 13, generated from the second core strobe signal CDS2 output by the second core chip 30, with the phase of the third comparison strobe signal, for example, CPDS3 in FIG. 13. The third core calibration circuit 470 increments the bits of the third code signal, for example, CODE3<1:4> in FIG. 13, when a third input update signal, for example, IUP<3> in FIG. 13, generated from the third update signal UPD<3> is enabled.

The third core calibration circuit 470 according to other embodiment initializes each of the bits of the third code signal, for example, CODE3<1:4> in FIG. 13, at a logic low level. The third core calibration circuit 470 sequentially increments the bits of the third code signal, for example, CODE3<1:4> in FIG. 13. The third core calibration circuit 470 sequentially increments the bits of the third code signal, for example, CODE3<1:4> in FIG. 13, until each of the bits of the third code signal is generated at a logic high level. The third core calibration circuit 470 stores the third code signal, for example, CODE3<1:4> in FIG. 13, generated when the third update signal UPD<3> is disabled at a logic low level.

After the start of the first training operation, the third core chip 40 generates the third core strobe signal CDS3 by delaying the strobe signal DQS. After the start of the second training operation, the third core chip 40 generates the third core strobe signal CDS3 by delaying the strobe signal DQS by the third delay amount based on the third code signal, for example, CODE3<1:4> in FIG. 12. After the start of the third training operation, the third core chip 40 increments the bits of the third code signal, for example, CODE3<1:4> in FIG. 12, while the third update signal UPD<3> is enabled. The third core chip calibrates the third delay amount based on the third code signal, for example, CODE3<1:4> in FIG. 12, and generates the third core strobe signal CDS3 by delaying the strobe signal DQS by the third delay amount.

The third core chip 40 according to an embodiment initializes each of the bits of the third code signal, for example, CODE3<1:4> in FIG. 13, at a logic low level after the start of the first training operation. After the start of the second training operation, the third core chip 40 sequentially increments the bits of the third code signal, for example, CODE3<1:4> in FIG. 13. After the start of the second training operation, the third core chip 40 generates the third core strobe signal CDS3 by delaying the strobe signal DQS by the third delay amount based on the third code signal, for example, CODE3<1:4> in FIG. 13. After the start of the third training operation, the third core chip 40 stores the third code signal, for example, CODE3<1:4> in FIG. 13, generated when the third update signal UPD<3> is disabled at a logic low level. The third core chip 40 determines the third delay amount based on the third code signal, for example, CODE3<1:4> in FIG. 13, that is stored, and generates the third core strobe signal CDS3 by delaying the strobe signal DQS by the third delay amount.

In FIG. 1, three core chips 20, 30, and 40 are stacked on or over the base chip 10, although various numbers of core chips, such as 4, 8, and 16, may be stacked on or over the base chip 10.

The semiconductor device 1 illustrated in FIG. 1 includes the base chip 10 and the core chips 20 to 40 stacked and electrically connected utilizing the through electrodes (TSV) similar to high bandwidth memory (HBM). A plurality of core chips stacked may be electrically connected utilizing through wire bonding according to an embodiment. The wire bonding may provide a signal path for signals that are input to and output from the base chip 10 and the core chips 20 to 40 according to an embodiment.

FIG. 2 is a block diagram illustrating an embodiment of the base chip 10 included, for example, in the semiconductor device 1 illustrated in FIG. 1. In an embodiment, the base chip 10 includes the calibration control circuit (CAL CTR CIR) 11, a base input and output circuit 13, and the strobe signal calibration circuit (DQS CAL CIR) 15.

The calibration control circuit 11 generates the reference strobe signal RDQS that is periodically toggled and the three pulses of the pulse signal PUL when the test mode signal TM is enabled. The calibration control circuit 11 generates the reference strobe signal RDQS that is periodically toggled and the first pulse of the pulse signal PUL when the test mode signal TM is enabled after the start of the first training operation. After the start of the first training operation, the calibration control circuit 11 generates first to third base transfer control signals BTC<1:3> that are enabled when the test mode signal TM is enabled. When the test mode signal TM is enabled after the start of the second training operation, the calibration control circuit 11 generates the reference strobe signal RDQS that is periodically toggled and the second pulse of the pulse signal PUL. After the start of the second training operation, the calibration control circuit 11 generates the first to third base transfer control signals BTC<1:3> and first to third base reception control signals BRC<1:3> that are enabled when the test mode signal TM is enabled. When the test mode signal TM is enabled after the start of the third training operation, the calibration control circuit 11 generates the reference strobe signal RDQS and the third pulse of the pulse signal PUL at a constant logic level, such as a logic low level. The calibration control circuit 11 generates first to third addition signals AD<1:3> based on the comparison signal CMP after the start of the second training operation. After the start of the third training operation, the calibration control circuit 11 generates the first to third base transfer control signals BTC<1:3> that are enabled when the test mode signal TM is enabled. After the start of the first training operation, the second training operation, and the third training operations, the test mode signal TM is enabled at a logic high level to adjust timing to align the strobe signal DQS for the base chip 10 and each of the core chips 20, 30, 40. The test mode signal TM is a signal that is enabled at a logic high level after the start of a boot-up operation after power is applied to the semiconductor device 1. The boot-up operation is an operation that outputs information that controls operation of the semiconductor device 1, for example, from a fuse array that includes a plurality of fuses.

In an embodiment, the base input and output circuit 13 includes a first base transmitter 131, a second base transmitter 132, a third base transmitter 133, a first base receiver 134, a second base receiver 135, and a third base receiver 136.

The first base transmitter 131 is turned on when the first base transfer control signal BTC<1> is enabled at a logic high level and outputs the reference strobe signal RDQS as the strobe signal DQS. The first base transmitter 131 is turned on when the first base transfer control signal BTC<1> is enabled at a logic high level and outputs the strobe signal DQS to the through electrode T11. The second base transmitter 132 is turned on when the second base transfer control signal BTC<2> is enabled at a logic high level and outputs the pulse signal PUL as the control signal CTR. The second base transmitter 132 is turned on when the second base transfer control signal BTC<2> is enabled at a logic high level and outputs the control signal CTR to the through electrode T12. The third base transmitter 133 is turned on when the third base transfer control signal BTC<3> is enabled at a logic high level and outputs the first to third addition signals AD<1:3> as the first to third update signals UPD<1:3>. The third base transmitter 133 is turned on when the third base transfer control signal BTC<3> is enabled at a logic high level and outputs the first to third update signals UPD<1:3> to the through electrode T13.

The first base receiver 134 is turned on when the first base reception control signal BRC<1> is enabled at a logic high level and outputs the first core strobe signal CDS1 as a first transfer strobe signal TD1. The first base receiver 134 is turned on when the first base reception control signal BRC<1> is enabled at a logic high level and outputs the first core strobe signal CDS1 received via the through electrode T14 as the first transfer strobe signal TD1. The second base receiver 135 is turned on when the second base reception control signal BRC<2> is enabled at a logic high level and outputs the second core strobe signal CDS2 as a second transfer strobe signal TD2. The second base receiver 135 is turned on when the second base reception control signal BRC<2> is enabled at a logic high level and outputs the second core strobe signal CDS2 received via the through electrode T15 as the second transfer strobe signal TD2. The third base receiver 136 is turned on when the third base reception control signal BRC<3> is enabled at a logic high level and outputs the third core strobe signal CDS3 as a third transfer strobe signal TD3. The third base receiver 136 is turned on when the third base reception control signal BRC<3> is enabled at a logic high level and outputs the third core strobe signal CDS3 received via the through electrode T16 as the third transfer strobe signal TD3. When a calibration enable signal CEN is enabled after the start of the second training operation, the strobe signal calibration circuit 15 generates the comparison signal CMP by comparing the phase of the first core strobe signal CDS1, the phase of the second core strobe signal CDS2, and the phase of the third core strobe signal CDS3 with the phase of the reference strobe signal RDQS. When the calibration enable signal CEN is enabled after the start of the second training operation, the strobe signal calibration circuit 15 generates the comparison signal CMP enabled at a logic high level when the phase of the first core strobe signal CDS1, the phase of the second core strobe signal CDS2, and the phase of the third core strobe signal CDS3, are different from the phase of the reference strobe signal RDQS. When the calibration enable signal CEN is enabled after the start of the second training operation, the strobe signal calibration circuit 15 generates the comparison signal CMP that is disabled at a logic low level when the phase of the first core strobe signal CDS1, the phase of the second core strobe signal CDS2, the phase of the third core strobe signal CDS3, and the phase of the reference strobe signal RDQS are substantially similar or identical. The calibration enable signal CEN is a signal that is enabled at a logic high level after the start of the second training operation to adjust timing to align the strobe signal DQS for the base chip 10 and each of the core chips 20, 30, 40.

Figure 3:
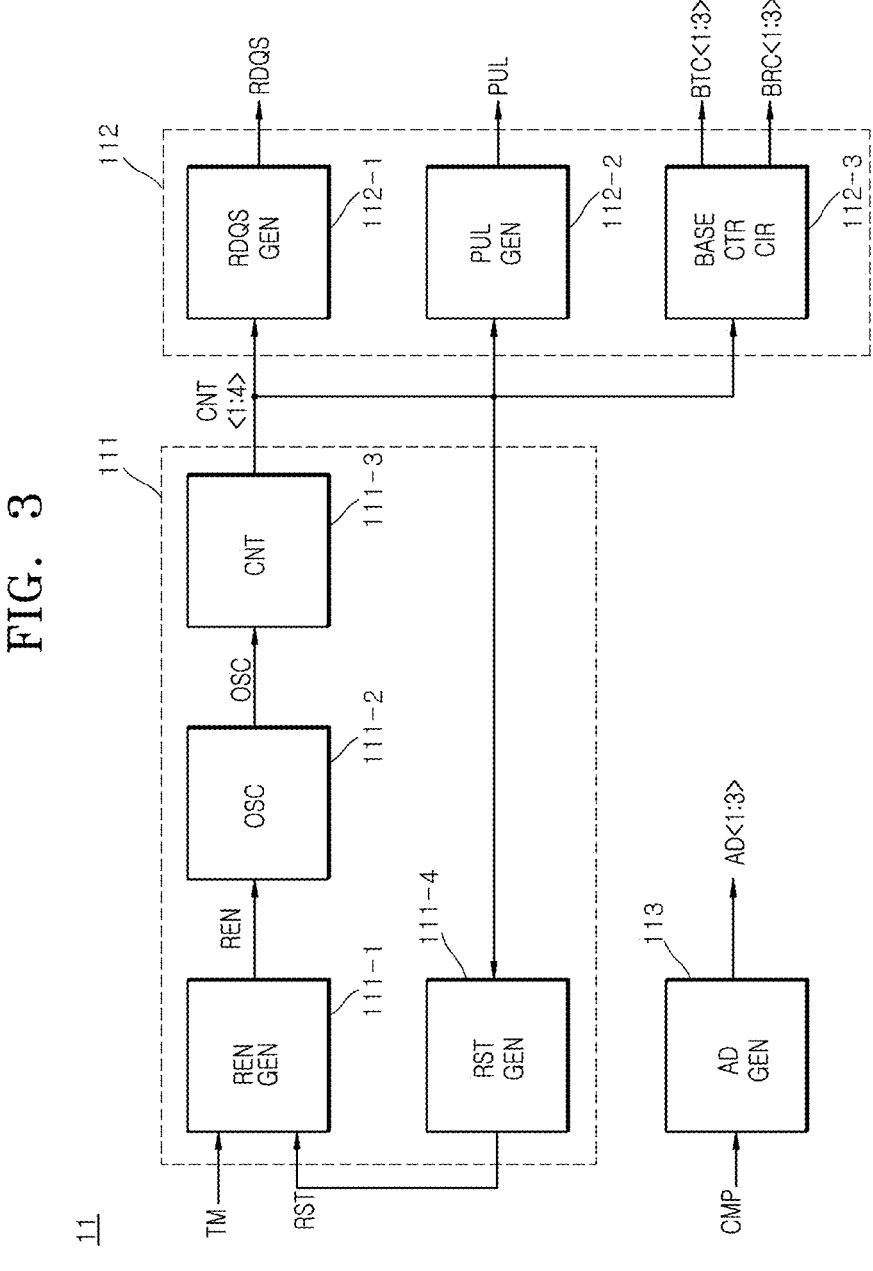
FIG. 3 is a block diagram illustrating an embodiment of a calibration control circuit included in a base chip according to the present disclosure.

FIG. 3 is a block diagram illustrating an embodiment of the calibration control circuit 11 included, for example, in the base chip 10 illustrated in FIG. 2. In an embodiment, the calibration control circuit 11 includes a counting signal generation circuit 111, a control signal generation circuit 112, and an addition signal generation circuit (ADD GEN) 113.

In an embodiment, the counting signal generation circuit 111 includes an enable signal generation circuit (REN GEN) 111-1, a periodic signal generation circuit (OSC) 111-2, a counter (CNT) 111-3, and a reset signal generation circuit (RST GEN) 111-4.

The enable signal generation circuit 111-1 generates an enable signal REN that is enabled during a predetermined interval based on the test mode signal TM and a reset signal RST. The enable signal generation circuit 111-1 generates the enable signal REN enabled at a logic high level from a time at which the test mode signal TM is enabled at a logic high level to a time at which the reset signal RST is enabled at a logic high level.

The periodic signal generation circuit 111-2 generates a cycle signal OSC including a pulse that is periodically generated based on the enable signal REN. The periodic signal generation circuit 111-2 generates the cycle signal OSC including a pulse that is periodically generated during an interval in which the enable signal REN is enabled at a logic high level. The periodic signal generation circuit 111-2 may be implemented with a common ring oscillator. The time at which the pulse of the cycle signal OSC is generated and the quantity of pulses of the cycle signal OSC may vary according to an embodiment.

The counter 111-3 generates first to fourth counting signals CNT<1:4> based on the pulse of the cycle signal OSC. The counter 111-3 generates the first to fourth counting signals CNT<1:4>, the bits of which are sequentially incremented in response to input of each pulse of the cycle signal OSC. For example, the bits of the counting signals CNT<1:4> may be incremented according to the sequence 0000, 0001, 0010, . . . 1110, 1111. The first to fourth counting signals CNT<1:4> each include four bits in this example, but may include a different quantity of bits according to an embodiment.

The reset signal generation circuit 111-4 generates the reset signal RST based on the first to fourth counting signals CNT<1:4>. The reset signal generation circuit 111-4 generates the reset signal RST that is enabled at a logic high level when the first to fourth counting signals CNT<1:4> are cycled sixteen times.

The counting signal generation circuit 111 generates the first to fourth counting signals CNT<1:4>, the bits of which are sequentially incremented when the test mode signal TM is enabled.

In an embodiment, the control signal generation circuit 112 includes a reference strobe signal generation circuit (RDQS GEN) 112-1, a pulse signal generation circuit (PUL GEN) 112-2, and a base control circuit (BASE CTR CIR) 112-3.

The reference strobe signal generation circuit 112-1 generates the reference strobe signal RDQS that is periodically toggled based on a logic level combination of the first to fourth counting signals CNT<1:4>. For example, the reference strobe signal RDQS is toggled up and down once each time the bits of the first to fourth counting signals CNT<1:4> are cycled one time or toggled once for each cycle of the bits of the first to fourth counting signals CNT<1:4> from 0000, 0001, 0010, . . . to 1111. The reference strobe signal generation circuit 112-1 generates the reference strobe signal RDQS that is periodically toggled from a time at which the first to fourth counting signals CNT<1:4> are cycled once to a time at which the first to fourth counting signals CNT<1:4> are cycled five times. Counting signals, such as counting signals CNT<1:4>, are considered to be cycled one time when each of the different values or combinations of the counting signals are generated one time, for example, the counting sequence 0000, 0001, 0010, 0011, 0100, 0101, 0110, 0111, 1000, 1001, 1010, 1011, 1100, 1101, 1110, and 1111. The reference strobe signal generation circuit 112-1 generates the reference strobe signal RDQS that is periodically toggled from a time at which the first to fourth counting signals CNT<1:4> are cycled six times to a time at which the first to fourth counting signals CNT<1:4> are cycled ten times. The reference strobe signal generation circuit 112-1 generates the reference strobe signal RDQS at a constant logic level, such as a logic low level, when the first to fourth counting signals CNT<1:4> are cycled eleven times or more.

The pulse signal generation circuit 112-2 generates the pulse signal PUL including the three pulses that are generated based on a logic level combination of the first to fourth counting signals CNT<1:4>. The pulse signal generation circuit 112-2 generates the first pulse of the pulse signal PUL from a time at which the first to fourth counting signals CNT<1:4> are cycled once to a time at which the first to fourth counting signals CNT<1:4> are cycled five times.

The pulse signal generation circuit 112-2 generates the second pulse of the pulse signal PUL from a time at which the first to fourth counting signals CNT<1:4> are cycled six times to a time at which the first to fourth counting signals CNT<1:4> are cycled ten times. The pulse signal generation circuit 112-2 generates the third pulse of the pulse signal PUL from a time at which the first to fourth counting signals CNT<1:4> are cycled eleven times to a time at which the first to fourth counting signals CNT<1:4> are cycled fifteen times.

The base control circuit 112-3 generates the first to third base transfer control signals BTC<1:3> and the first to third base reception control signals BRC<1:3> based on a logic level combination of the first to fourth counting signals CNT<1:4>. The base control circuit 112-3 generates the first to third base transfer control signals BTC<1:3> that are enabled from a time at which the first to fourth counting signals CNT<1:4> are cycled once to a time at which the first to fourth counting signals CNT<1:4> are cycled five times. The base control circuit 112-3 generates the first to third base transfer control signals BTC<1:3> that are enabled from a time at which the first to fourth counting signals CNT<1:4> are cycled six times to a time at which the first to fourth counting signals CNT<1:4> are cycled ten times. The base control circuit 112-3 generates the first to third base transfer control signals BTC<1:3> that are enabled from a time at which the first to fourth counting signals CNT<1:4> are cycled eleven times to a time at which the first to fourth counting signals CNT<1:4> are cycled fifteen times. The base control circuit 112-3 generates the first to third base reception control signals BRC<1:3> that are enabled from a time at which the first to fourth counting signals CNT<1:4> are cycled six times to a time at which the first to fourth counting signals CNT<1:4> are cycled ten times. The base control circuit 112-3 generates the first to third base transfer control signals BTC<1:3> that are enabled after the start of the first to third training operations. The base control circuit 112-3 generates the base reception control signals BRC<1:3> that are enabled after the start of the second training operation.

The addition signal generation circuit 113 generates the first to third addition signals AD<1:3> based on the comparison signal CMP. The addition signal generation circuit 113 generates the first to third addition signals AD<1:3> that are enabled at a logic high level when the comparison signal CMP is enabled at a logic high level. The addition signal generation circuit 113 generates the first to third addition signals AD<1:3> that are disabled at a logic low level when the comparison signal CMP is disabled at a logic low level.

Figure 4:
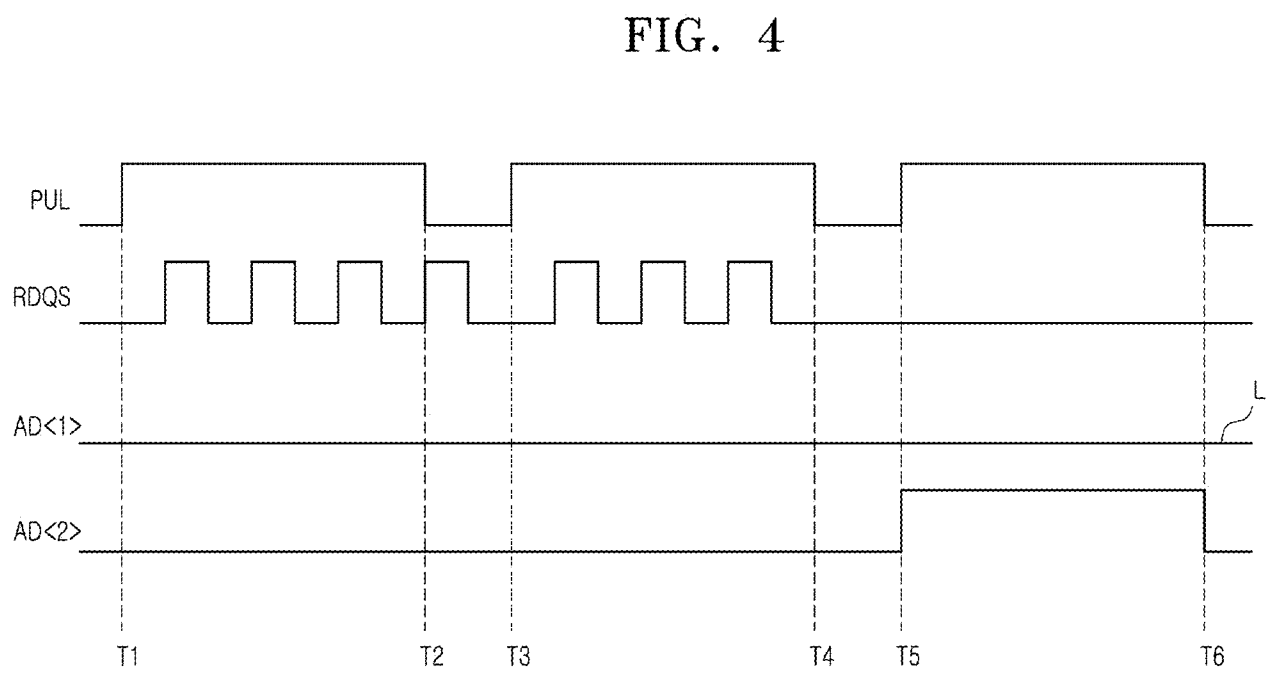

FIG. 4 is a timing diagram during operation of the calibration control circuit 11, for example, as illustrated in FIG. 3. An operation including generating, by the calibration control circuit 11, the reference strobe signal RDQS, the pulse signal PUL, and the first and second addition signals AD<1:2> that update the second code signal, for example, CODE2<1:4> in FIG. 12, of the second core chip 30 during the first to third training operations is described as an example with reference to FIG. 4.

At time T1, the pulse signal generation circuit 112-2 generates the pulse signal PUL at a logic high level when the first to fourth counting signals CNT<1:4> reach a count of one, for example, 0001.

The reference strobe signal generation circuit 112-1 generates the reference strobe signal RDQS that is toggled once (one rising edge and one falling edge) after each time the first to fourth counting signals CNT<1:4> are incremented one time.

At time T2, the pulse signal generation circuit 112-2 generates the pulse signal PUL at a logic low level when the first to fourth counting signals CNT<1:4> are incremented five times, for example a count of 0101.

The reference strobe signal generation circuit 112-1 generates the reference strobe signal RDQS at a constant logic level, such as a logic low level, after the reference strobe signal RDQS is toggled in response to incrementing the first to fourth counting signals CNT<1:4> five times.

Time T1 through time T2 correspond to a time interval from time T1 at which the first to fourth counting signals CNT<1:4> are incremented once to time T2 at which the first to fourth counting signals CNT<1:4> are incremented five times, during which time interval the first training operation is performed.

At time T3, the pulse signal generation circuit 112-2 generates the pulse signal PUL at a logic high level once the first to fourth counting signals CNT<1:4> are incremented six times, for example a count of 0110.

After the first to fourth counting signals CNT<1:4> are incremented six times, the reference strobe signal generation circuit 112-1 generates the reference strobe signal RDQS that is toggled once each time the first to fourth counting signals CNT<1:4> are incremented.

At time T4, the pulse signal generation circuit 112-2 generates the pulse signal PUL at a logic low level once the first to fourth counting signals CNT<1:4> are incremented ten times, for example a count of 1010.

The reference strobe signal generation circuit 112-1 generates the reference strobe signal RDQS at a constant logic level, such as a logic low level, after the first to fourth counting signals CNT<1:4> are incremented ten times.

Time T3 through time T4 correspond to an interval during which the first to fourth counting signals CNT<1:4> are incremented from six times to time T4 at which the first to fourth counting signals CNT<1:4> are incremented ten times, during which time interval the second training operation is performed.

At time T5, the pulse signal generation circuit 112-2 generates the pulse signal PUL at a logic high level once the first to fourth counting signals CNT<1:4> are incremented eleven times, for example a count of 1011.

The reference strobe signal generation circuit 112-1 generates the reference strobe signal RDQS at a constant logic level, such as a logic low level, after the first to fourth counting signals CNT<1:4> are incremented eleven times.

The base control circuit 112-3 generates the first to third base transfer control signals BTC<1:3> that are enabled after the start of the third training operation.

The addition signal generation circuit 113 generates the first addition signal AD<1> at a logic low level and the second addition signal AD<2> at a logic high level based on the comparison signal CMP at a logic high level when the phase of the second core strobe signal CDS2 generated by the second core chip 30 is different from the phase of the reference strobe signal RDQS during the second training operation.

The base chip 10 outputs the first addition signal AD<1> at a logic low level as the first update signal UPD<1> and outputs the second addition signal AD<2> at a logic high level as the second update signal UPD<2>.

The second core chip 30 increments the bits of the second code signal, for example, CODE2<1:4> in FIG. 12, upon receiving the second update signal UPD<2> at a logic high level.

At time T6, the pulse signal generation circuit 112-2 generates the pulse signal PUL at a logic low level once the first to fourth counting signals CNT<1:4> are incremented fifteen times, for example a count of 1111.

Time T5 through time T6 correspond to a time interval from time T5 which the first to fourth counting signals CNT<1:4> are incremented eleven times to time T6 at which the first to fourth counting signals CNT<1:4> are incremented fifteen times, during which time interval the third training operation is performed.

Figure 5:
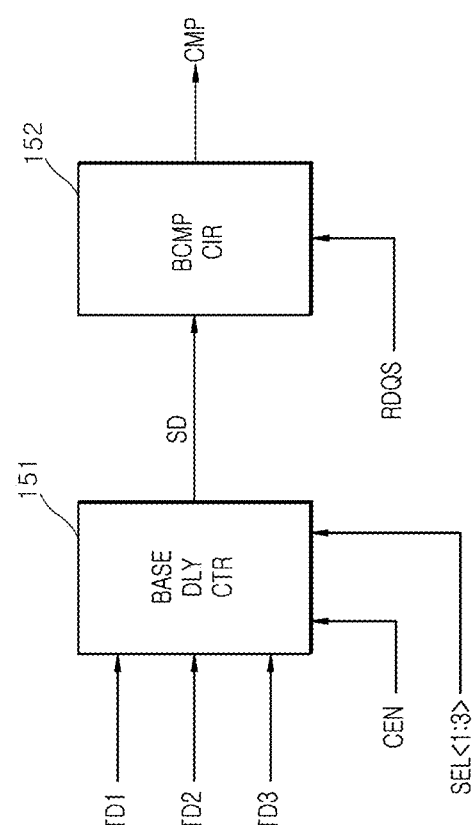
FIG. 5 is a block diagram illustrating an embodiment of a strobe signal calibration circuit included in a base chip according to the present disclosure.

FIG. 5 is a block diagram illustrating an embodiment of the strobe signal calibration circuit 15 included, for example, in the base chip 10 illustrated in FIG. 2. In an embodiment, the strobe signal calibration circuit 15 includes a base delay control circuit (BASE DLY CTR) 151 and a base comparison circuit (BCMP CIR) 152.

The base delay control circuit 151 generates a selection strobe signal SD based on the calibration enable signal CEN, the first transfer strobe signal TD1, the second transfer strobe signal TD2, the third transfer strobe signal TD3, and first to third selection signals SEL<1:3>. The base delay control circuit 151 delays the first transfer strobe signal TD1, the second transfer strobe signal TD2, and the third transfer strobe signal TD3 by a reference delay amount. The base delay control circuit 151 outputs one of the first transfer strobe signal TD1, the second transfer strobe signal TD2, and the third transfer strobe signal TD3 that are delayed by the reference delay amount as the selection strobe signal SD based on the first to third selection signals SEL<1:3> when the calibration enable signal CEN is enabled. The reference delay amount may be the same delay amount for each of the first signal path, the fourth signal path, the fifth signal path, and the sixth signal path along which the strobe signal DQS, the first core strobe signal CDS1, the second core strobe signal CDS2, and the third core strobe signal CDS3 are input and output.

The base comparison circuit 152 generates the comparison signal CMP by comparing the phase of the selection strobe signal SD with the phase of the reference strobe signal RDQS. The base comparison circuit 152 generates the comparison signal CMP that is enabled at a logic high level when the phase of the selection strobe signal SD is different from the phase of the reference strobe signal RDQS. The base comparison circuit 152 generates the comparison signal CMP that is disabled at a logic low level when the phase of the selection strobe signal SD has the same or substantially similar phase as the reference strobe signal RDQS.

Figure 6:
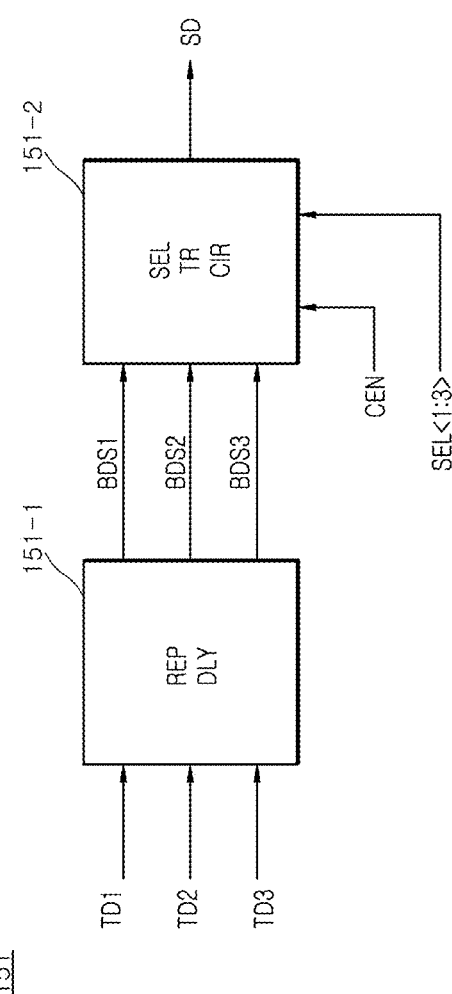
FIG. 6 is a block diagram illustrating an embodiment of a base delay control circuit included in a strobe signal calibration circuit according to the present disclosure.

FIG. 6 is a block diagram illustrating an embodiment of the base delay control circuit 151 included, for example, in the strobe signal calibration circuit 15 illustrated in FIG. 5. In an embodiment, the base delay control circuit 151 includes a replica delay circuit (REP DLY) 151-1 and a selection transmission circuit (SEL TR CIR) 151-2.

The replica delay circuit 151-1 generates a first base strobe signal BDS1, a second base strobe signal BDS2, and a third base strobe signal BDS3 by delaying the first transfer strobe signal TD1, the second transfer strobe signal TD2, and the third transfer strobe signal TD3 by a reference delay amount. The reference delay amount for the replica delay circuit 151-1 may be the same as the delay amount for each of the first signal path, the fourth signal path, the fifth signal path, and the sixth signal path along which the strobe signal DQS, the first core strobe signal CDS1, the second core strobe signal CDS2, and the third core strobe signal CDS3 are input and output.

The selection transmission circuit 151-2 outputs one of the first base strobe signal BDS1, the second base strobe signal BDS2, and the third base strobe signal BDS3 as the selection strobe signal SD based on the first to third selection signals SEL<1:3> when the calibration enable signal CEN is enabled.

The selection transmission circuit 151-2 outputs the first base strobe signal BDS1 as the selection strobe signal SD when the calibration enable signal CEN is enabled and the first selection signal SEL<1> is enabled. The selection transmission circuit 151-2 outputs the second base strobe signal BDS2 as the selection strobe signal SD when the calibration enable signal CEN is enabled and the second selection signal SEL<2> is enabled. The selection transmission circuit 151-2 outputs the third base strobe signal BDS3 as the selection strobe signal SD when the calibration enable signal CEN is enabled and the third selection signal SEL<3> is enabled. The first selection signal SEL<1> is a signal that is enabled when the first core strobe signal CDS1 is output by the first core chip 20. The second selection signal SEL<2> is a signal that is enabled when the second core strobe signal CDS2 is output by the second core chip 30. The third selection signal SEL<3> is a signal that is enabled when the third core strobe signal CDS3 is output by the third core chip 40.

FIG. 7 is a block diagram illustrating an embodiment of the first core chip 20 included, for example, in the semiconductor device 1 illustrated in FIG. 1. In an embodiment, the first core chip 20 includes a first core control circuit ($1^{st}$ CORE CTR) 210, a first core input and output circuit 230, a first core delay control circuit ($1^{st}$ CORE DLY) 250, a first core calibration circuit ($1^{st}$ CORE CAL) 270, and a first memory circuit ($1^{st}$ MEM CIR) 290.

The first core control circuit 210 generates a first core transfer control signal CTC<1> based on the pulses of the control signal CTR. The first core control circuit 210 generates the first core transfer control signal CTC<1> that is enabled at a logic high level when the first pulse and second pulse of the control signal CTR are input. The first core control circuit 210 generates the first core transfer control signal CTC<1> that is disabled at a logic low level when the third pulse of the control signal CTR is input.

The first core control circuit 210 generates first to fourth core reception control signals CRC<1:4> based on the pulses of the control signal CTR. The first core control circuit 210 generates the first to third core reception control signals CRC<1:3> that are enabled at a logic high level when the first pulse and second pulse of the control signal CTR are input. The first core control circuit 210 generates the fourth core reception control signal CRC<4> that is disabled at a logic low level when the first pulse and second pulse of the control signal CTR are input. The first core control circuit 210 generates the first to third core reception control signals CRC<1:3> that are disabled at a logic low level when the third pulse of the control signal CTR is input. The first core control circuit 210 generates the fourth core reception control signal CRC<4> that is enabled at a logic high level when the third pulse of the control signal CTR is input.

In an embodiment, the first core input and output circuit 230 includes a first receiver 231, a second receiver 232, a third receiver 233, a fourth receiver 234, and a first transmitter 235.

The first receiver 231 is turned on when the first core reception control signal CRC<1> is enabled at a logic high level, for example. The first receiver 231 receives the strobe signal DQS and outputs the strobe signal DQS as the first input strobe signal IDS1 when the first core reception control signal CRC<1> is enabled at a logic high level.

The second receiver 232 is turned on when the second core reception control signal CRC<2> is enabled at a logic high level, for example. The second receiver 232 receives the second core strobe signal CDS2 and outputs the second core strobe signal CDS2 as the second input strobe signal IDS2 when the second core reception control signal CRC<2> is enabled at a logic high level.

The third receiver 233 is turned on when the third core reception control signal CRC<3> is enabled at a logic high level, for example. The third receiver 233 receives the third core strobe signal CDS3 and outputs the third core strobe signal CDS3 as the third input strobe signal IDS3 when the third core reception control signal CRC<3> is enabled at a logic high level.

The fourth receiver 234 is turned on when the fourth core reception control signal CRC<4> is enabled at a logic high level, for example. The fourth receiver 234 receives the first update signal UPD<1> and outputs the first update signal UPD<1> as the first input update signal IUP1 when the fourth core reception control signal CRC<4> is enabled at a logic high level.

The first transmitter 235 is turned on when the first core transfer control signal CTC<1> is enabled at a logic high level, for example. The first transmitter 235 receives the first comparison strobe signal CPDS1 and outputs the first comparison strobe signal CPDS1 as the first core strobe signal CDS1 when the first core transfer control signal CTC<1> is enabled at a logic high level.

The first delay amount for the first core delay control circuit 250 is based on the first code signal CODE1<1:4>. The first core delay control circuit 250 generates the first comparison strobe signal CPDS1 by delaying the first input strobe signal IDS1 by the first delay amount when the pulse of the control signal CTR is input.

The first core calibration circuit 270 initializes each of the bits of the first code signal CODE1<1:4> during the first training operation. The first core calibration circuit 270 generates the first code signal CODE1<1:4> by comparing the phase of the first comparison strobe signal CPDS1 with the phase of the input strobe signal IDS2 and the phase of the third input strobe signal IDS3 during the second training operation. During the second training operation, the first core calibration circuit 270 changes a logic level combination of the first code signal CODE1<1:4> such that the phase of the first comparison strobe signal CPDS1, the phase of the second input strobe signal IDS2, and the phase of the third input strobe signal IDS3 are substantially similar or identical during the second training operation. The first core calibration circuit 270 increments the bits of the first code signal CODE1<1:4> while the first input update signal IUP1 is enabled during the third training operation. The first core calibration circuit 270 increments or decrements the values of the bits of the first code signal CODE1<1:4> when the first input update signal IUP1 is enabled during the third training operation. The first code signal CODE1<1:4>, after each of the bits of which is initialized, is generated having the same delay amount as the delay amount for each of the first signal path and the fourth signal path along which the strobe signal DQS and the first core strobe signal CDS1 are input and output, respectively.

The first core calibration circuit 270 according to an embodiment initializes each of the bits of the first code signal CODE1<1:4> at a logic low level during the first training operation. The first core calibration circuit 270 sequentially increments the bits of the first code signal CODE1<1:4> during the second training operation. The first core calibration circuit 270 sequentially increments or sequences through the bits of the first code signal CODE1<1:4> from 0000 until each of the bits of the first code signal CODE1<1:4> is generated at a logic high level at 1111 during the second training operation. The first core calibration circuit 270 stores the generated first code signal CODE1<1:4> when the first update signal UPD<1> is disabled at a logic low level during the third training operation.

The first memory circuit 290 is implemented with a common memory cell array including a plurality of memory cells (not illustrated). The first memory circuit 290 outputs first data DATA1 stored in the plurality of memory cells, in synchronization with the first comparison strobe signal CPDS1 after the start of a read operation. The first memory circuit 290 stores the first data DATA1 in the plurality of memory cells in synchronization with the first comparison strobe signal CPDS1 after the start of a write operation. The first data DATA1 may be common data including a plurality of bits.

Figure 8:
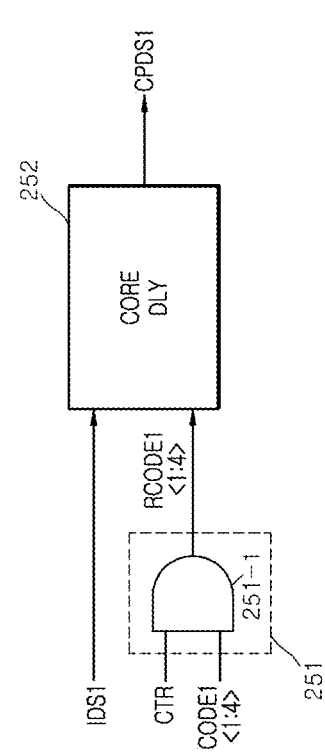
FIG. 8 is a block diagram illustrating an embodiment of a first core delay control circuit included in the first core chip according to the present disclosure.

FIG. 8 is a block diagram illustrating an embodiment of the first core delay control circuit 250 included, for example, in the first core chip 20 illustrated in FIG. 7. In an embodiment, the first core delay control circuit 250 includes a first input code signal generation circuit 251 and a first core delay circuit (CORE DLY) 252.

The first input code signal generation circuit 251 is implemented with an AND gate 251-1. The first input code signal generation circuit 251 generates a first input code signal RCODE1<1:4> based on the control signal CTR and the first code signal CODE1<1:4>. The first input code signal generation circuit 251 generates the first input code signal RCODE1<1:4> by buffering the first code signal CODE1<1:4> when the pulse of the control signal CTR is input. A first delay amount for the first core delay circuit 252 is based on the first input code signal RCODE1<1:4>. The first core delay circuit 252 generates the first comparison strobe signal CPDS1 by delaying the first input strobe signal IDS1 by the first delay amount based on the first input code signal RCODE1<1:4>. The first core delay circuit 252 increases the first delay amount when the bits of the first input code signal RCODE1<1:4> are incremented and generated, for example. The first core delay circuit 252 decreases the first delay amount when the bits of the first input code signal RCODE1<1:4> are decremented and generated, for example.

For example, when the bits of the first input code signal RCODE1<1:4> are incremented from logic level combination L, L, H, L or 0010, and the bits of the first input code signal RCODE1<1:4> are generated at logic level combination L, L, H, H or 0011, the first delay amount for the first core delay circuit 252 is increased. When the bits of the first input code signal RCODE1<1:4> are decremented from logic level combination L, L, H, L or 0010, and the bits of the first input code signal RCODE1<1:4> are generated at logic level combination L, L, L, H or 0001, the first delay amount for the first core delay circuit 252 is decreased. The bits of the first input code signal RCODE1<1:4> are generated at logic level combination L, L, H, L when the first bit RCODE1<1> of the first input code signal is at a logic low level L, the second bit RCODE1<2> of the first input code signal is at a logic high level H, the third bit RCODE1<3> of the first input code signal is at a logic low level L, and the fourth bit RCODE1<4> of the first input code signal is at a logic low level L.

FIG. 9 is a block diagram illustrating an embodiment of the first core calibration circuit 270 included, for example, in the first core chip 20 illustrated in FIG. 7. In an embodiment, the first core calibration circuit 270 includes a first core comparison circuit (CORE CMP CIR) 271, a first internal code signal generation circuit (ICD GEN) 272, a first addition circuit (ADD CIR) 273, a first output control signal generation circuit (OCTR GEN) 274, and a first selection transmission circuit (SEL TR CIR) 275.

The first core comparison circuit 271 generates a first core comparison signal CRCMP by comparing the phase of the first comparison strobe signal CPDS1 with the phase of second input strobe signal IDS2 and the phase of the third input strobe signal IDS3. The first core comparison circuit 271 generates the first core comparison signal CRCMP that is enabled at a logic high level when the phase of the first comparison strobe signal CPDS1 is different from the phase of the second input strobe signal IDS2 and the phase of the third input strobe signal IDS3. The first core comparison circuit 271 generates the first core comparison signal CRCMP that is disabled at a logic low level when the phase of the first comparison strobe signal CPDS1, the phase of the second input strobe signal IDS2, and the phase of third input strobe signal IDS3 are substantially similar or identical.

The first internal code signal generation circuit 272 generates a first internal code signal ICD1<1:4>, each of the bits of which are initialized when an initialization signal INIT is enabled. The first internal code signal generation circuit 272 increments the bits of the first internal code signal ICD1<1:4> when the first core comparison signal CRCMP is enabled. The initialization signal INIT is a signal that is enabled at a logic high level after the start of the first training operation. The first internal code signal ICD1<1:4> is generated having the same delay amount as the delay amount for each of the first signal path and the fourth signal path along which the strobe signal DQS and the first core strobe signal CDS1 are input and output.

The first addition circuit 273 generates a first addition code signal SCD<1:4> by incrementing the bits of first internal code signal ICD1<1:4>, when the first input update signal IUP1 is enabled.

The first output control signal generation circuit 274 generates an output control signal OCTR that is disabled at a logic low level when the initialization signal INIT is enabled. The first output control signal generation circuit 274 generates the output control signal OCTR that is enabled at a logic high level when the pulse of the control signal CTR is input and the first input update signal IUP1 is enabled at a logic high level.

The first selection transmission circuit 275 outputs one of the first internal code signal ICD1<1:4> and the first addition code signal SCD<1:4> as the first code signal CODE<1:4> based on a logic level of the output control signal OCTR. The first selection transmission circuit 275 outputs the first internal code signal ICD1<1:4> as the first code signal CODE<1:4> when the output control signal OCTR is disabled at a logic low level. The first selection transmission circuit 275 outputs the first addition code signal SCD<1:4> as the first code signal CODE<1:4> when the output control signal OCTR is enabled at a logic high level.

Figure 10:
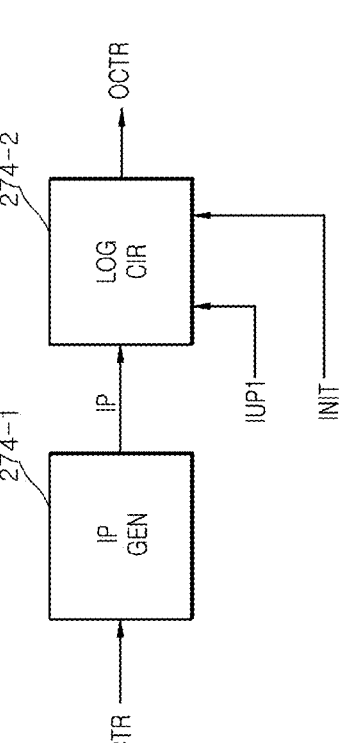
FIG. 10 is a block diagram illustrating an embodiment of a first output control signal generation circuit included in a first core calibration circuit according to the present disclosure.

FIG. 10 is a block diagram illustrating an embodiment of the first output control signal generation circuit 274 included, for example, in the first core calibration circuit 270 illustrated in FIG. 9. In an embodiment, the first output control signal generation circuit 274 includes an internal pulse generation circuit (IP GEN) 274-1 and a logic circuit (LOG CIR) 274-2.

The internal pulse generation circuit 274-1 generates an internal pulse IP based on the pulse of the control signal CTR. The internal pulse generation circuit 274-1 generates the internal pulse IP that is enabled at a logic high level when the third pulse of the control signal CTR is input.

The logic circuit 274-2 generates the output control signal OCTR that is disabled at a logic low level when the initialization signal INIT is enabled. The logic circuit 274-2 generates the output control signal OCTR that is enabled at a logic high level when the internal pulse IP is enabled at a logic high level and the first input update signal IUP1 is enabled at a logic high level.

Figure 11:
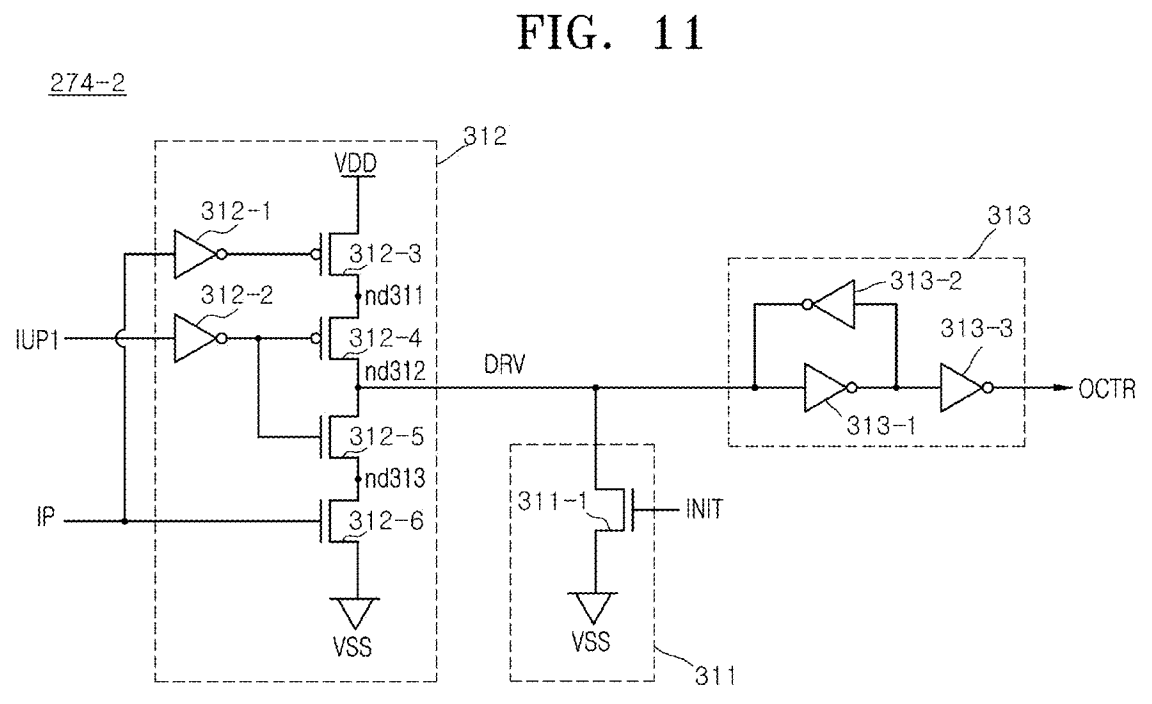

FIG. 11 is a circuit diagram illustrating an embodiment of the logic circuit 274-2 included, for example, in the first output control signal generation circuit 274 illustrated in FIG. 10. In an embodiment, the logic circuit 274-2 includes an initialization circuit 311, a driving signal generation circuit 312, and a latch circuit 313.

In an embodiment, the initialization circuit 311 is implemented with an NMOS transistor 311-1 connected between a node nd312 and a ground voltage VSS. The initialization circuit 311 drives a driving signal DRV to a logic low level by discharging the charge of the node nd312 when the initialization signal INIT is enabled at a logic high level.

In an embodiment, the driving signal generation circuit 312 is implemented with inverters 312-1 and 312-2, a PMOS transistor 312-3 connected between a power source voltage VDD and a node nd311, a PMOS transistor 312-4 connected between the node nd311 and the node nd312, an NMOS transistor 312-5 connected between the node nd312 and a node nd313, and an NMOS transistor 312-6 connected between the node nd313 and the ground voltage VSS. The driving signal generation circuit 312 generates the driving signal DRV that is enabled at a logic high level when the internal pulse IP is enabled at a logic high level and the first input update signal IUP1 is enabled at a logic high level. The driving signal generation circuit 312 generates the driving signal DRV that is disabled at a logic low level when the internal pulse IP is enabled at a logic high level and the first input update signal IUP1 is disabled at a logic low level.

In an embodiment, the latch circuit 313 is implemented with inverters 313-1, 313-2, and 313-3. The latch circuit 313 latches the driving signal DRV. The latch circuit 313 generates the output control signal OCTR by buffering the driving signal DRV that is latched. The latch circuit 313 generates the output control signal OCTR that is enabled at a logic high level when the driving signal DRV is enabled at a logic high level. The latch circuit 313 generates the output control signal OCTR that is disabled at a logic low level when the driving signal DRV is disabled at a logic low level.

FIG. 12 is a block diagram illustrating an embodiment of the second core chip 30 included, for example, in the semiconductor device 1 illustrated in FIG. 1. In an embodiment, the second core chip includes a second core control circuit (2$^{nd}$ CORE CTR) 310, a second core input and output circuit 330, a second core delay control circuit (2$^{nd}$ CORE DLY) 350, a second core calibration circuit (2$^{nd}$ CORE CAL) 370, and a second memory circuit (2$^{nd}$ MEM CIR) 390.

The second core control circuit 310 generates a second core transfer control signal CTC<2> based on the pulses of the control signal CTR. The second core control circuit 310 generates the second core transfer control signal CTC<2> that is enabled at a logic high level when the first pulse and second pulse of the control signal CTR are input. The second core control circuit 310 generates the second core transfer control signal CTC<2> that is disabled at a logic low level when the third pulse of the control signal CTR is input.

The second core control circuit 310 generates fifth to eighth core reception control signals CRC<5:8> based on the pulses of the control signal CTR. The second core control circuit 310 generates the fifth to seventh core reception control signals CRC<5:7> that are enabled at a logic high level when the first pulse and second pulse of the control signal CTR are input. The second core control circuit 310 generates the eighth core reception control signal CRC<8> disabled at a logic low level when the first pulse and second pulse of the control signal CTR are input. The second core control circuit 310 generates the fifth to seventh core reception control signals CRC<5:7> disabled at a logic low level when the third pulse of the control signal CTR is input. The second core control circuit 310 generates the eighth core reception control signal CRC<8> enabled at a logic high level when the third pulse of the control signal CTR is input.

In an embodiment, the second core input and output circuit 330 includes a fifth receiver 331, a sixth receiver 332, a seventh receiver 333, an eighth receiver 334, and a second transmitter 335.

The fifth receiver 331 is turned on when the fifth core reception control signal CRC<5> is enabled at a logic high level, for example. The fifth receiver 331 receives the strobe signal DQS and outputs the strobe signal DQS as the fourth input strobe signal IDS4 when the fifth core reception control signal CRC<5> is enabled at a logic high level.

The sixth receiver 332 is turned on when the sixth core reception control signal CRC<6> is enabled to a logic high level, for example. The sixth receiver 332 receives the first core strobe signal CDS1 and outputs the first core strobe signal CDS1 as the fifth input strobe signal IDS5 when the sixth core reception control signal CRC<6> is enabled at a logic high level.

The seventh receiver 333 is turned on when the seventh core reception control signal CRC<7> is enabled at a logic high level, for example. The seventh receiver 333 receives the third core strobe signal CDS3 and outputs the third core strobe signal CDS3 as the sixth input strobe signal IDS6 when the seventh core reception control signal CRC<7> is enabled at a logic high level.

The eighth receiver 334 is turned on when the eighth core reception control signal CRC<8> is enabled at a logic high level, for example. The eighth receiver 334 receives the second update signal UPD<2> and outputs the second update signal UPD<2> as the second input update signal IUP2 when the eighth core reception control signal CRC<8> is enabled to a logic high level.

The second transmitter 335 is turned on when the second core transfer control signal CTC<2> is enabled at a logic high level, for example. The second transmitter 335 receives the second comparison strobe signal CPDS2 and outputs the second comparison strobe signal CPDS2 as the second core strobe signal CDS2 when the second core transfer control signal CTC<2> is enabled at a logic high level.

The second delay amount for the second core delay control circuit 350 is based on the second code signal CODE2<1:4>. The second core delay control circuit 350 generates the second comparison strobe signal CPDS2 by delaying the fourth input strobe signal IDS4 by the second delay amount when the pulse of the control signal CTR is input. The second core delay control circuit 350 is implemented using the same circuit as the first core delay control circuit 250 illustrated in FIG. 8 and performs the same operations as the first core delay control circuit 250, except that the input and output signals of the second core delay control circuit 350 are different from the input and output signals of the first core delay control circuit 250.

The second core calibration circuit 370 initializes each of the bits of the second code signal CODE2<1:4> during the first training operation. The second core calibration circuit 370 generates the second code signal CODE2<1:4> by comparing the phase of the second comparison strobe signal CPDS2 with the phase of the fifth input strobe signal IDS5 and the phase of the sixth input strobe signal IDS6 during the second training operation. During the second training operation, the second core calibration circuit 370 changes a logic level combination of the second code signal CODE2<1:4> such that the phase of the second comparison strobe signal CPDS2, the phase of the fifth input strobe signal IDS5, and the phase of the sixth input strobe signal IDS6 are substantially similar or identical. The second core calibration circuit 370 increments the bits of the second code signal CODE2<1:4> when the second input update signal IUP2 is enabled during the third training operation. The second core calibration circuit 370 increments or decrements the values of the bits of the second code signal CODE2<1:4> when the second input update signal IUP2 is enabled during the third training operation. The second code signal CODE2<1:4> is generated having the same delay amount as the delay amount for each of the first signal path and the fifth signal path along which the strobe signal DQS and the second core strobe signal CDS2 are input and output. The second core calibration circuit 370 is implemented using the same circuit as the first core calibration circuit 270 illustrated in FIG. 9 to FIG. 11 and performs the same operations as the first core calibration circuit 270, except that the input and output signals of the second core calibration circuit 370 are different from the input and output signals of the first core calibration circuit 270.

The second core calibration circuit 370 according to an embodiment initializes each of the bits of the second code signal CODE2<1:4> at a logic low level during the first training operation. The second core calibration circuit 370 sequentially increments the bits of the second code signal CODE2<1:4> during the second training operation. The second core calibration circuit 370 sequentially increments the bits of the second code signal CODE2<1:4> until each of the bits of the second code signal CODE2<1:4> is generated at a logic high level during the second training operation. The second core calibration circuit 370 stores the generated second code signal CODE2<1:4> when the second update signal UPD<2> is disabled at a logic low level during the third training operation.

The second memory circuit 390 is implemented with a common memory cell array including a plurality of memory cells (not illustrated). The second memory circuit 390 outputs second data DATA2 stored in the plurality of memory cells, in synchronization with the second comparison strobe signal CPDS2 after the start of a read operation. The second memory circuit 390 stores the second data DATA2 in the plurality of memory cells in synchronization with the second comparison strobe signal CPDS2 after the start of a write operation. The second data DATA2 may be common data including a plurality of bits.

FIG. 13 is a block diagram illustrating an embodiment of the third core chip 40 included, for example, in the semiconductor device 1 illustrated in FIG. 1. In an embodiment, the third core chip 40 includes a third core control circuit ($3^{rd}$ CORE CTR) 410, a third core input and output circuit 430, a third core delay control circuit ($3^{rd}$ CORE DLY) 450, a third core calibration circuit ($3^{rd}$ CORE CAL) 470, and a third memory circuit ($3^{rd}$ MEM CIR) 490.

The third core control circuit 410 generates a third core transfer control signal CTC<3> based on the pulses of the control signal CTR. The third core control circuit 410 generates the third core transfer control signal CTC<3> that is enabled at a logic high level when the first pulse and second pulse of the control signal CTR are input. The third core control circuit 410 generates the third core transfer control signal CTC<3> that is disabled at a logic low level when the third pulse of the control signal CTR is input.

The third core control circuit 410 generates ninth to twelfth core reception control signals CRC<9:12> based on the pulses of the control signal CTR. The third core control circuit 410 generates the ninth to eleventh core reception control signals CRC<9:11> that are enabled at a logic high level when the first pulse and second pulse of the control signal CTR are input. The third core control circuit 410 generates the twelfth core reception control signal CRC<12> disabled at a logic low level when the first pulse and second pulse of the control signal CTR are input. The third core control circuit 410 generates the ninth to eleventh core reception control signals CRC<9:11> disabled at a logic low level when the third pulse of the control signal CTR is input. The third core control circuit 410 generates the twelfth core reception control signal CRC<12> enabled at a logic high level when the third pulse of the control signal CTR is input.

In an embodiment, the third core input and output circuit 430 includes a ninth receiver 431, a tenth receiver 432, an eleventh receiver 433, a twelfth receiver 434, and a third transmitter 435.

The ninth receiver 431 is turned on when the ninth core reception control signal CRC<9> is enabled at a logic high level, for example. The ninth receiver 431 receives the strobe signal DQS and outputs the strobe signal DQS as the seventh input strobe signal IDS7, when the ninth core reception control signal CRC<9> is enabled at a logic high level.

The tenth receiver 432 is turned on when the tenth core reception control signal CRC<10> is enabled at a logic high level, for example. The tenth receiver 432 receives the first core strobe signal CDS1 and outputs the first core strobe signal CDS1 as the eighth input strobe signal IDS8 when the tenth core reception control signal CRC<10> is enabled at a logic high level.

The eleventh receiver 433 is turned on when the eleventh core reception control signal CRC<11> is enabled at a logic high level, for example. The eleventh receiver 433 receives the second core strobe signal CDS2 and outputs the second core strobe signal CDS2 as the ninth input strobe signal IDS9 when the eleventh core reception control signal CRC<11> is enabled at a logic high level.

The twelfth receiver 434 is turned on when the twelfth core reception control signal CRC<12> is enabled at a logic high level, for example. The twelfth receiver 434 receives the third update signal UPD<3> and outputs the third update signal UPD<3> as a third input update signal IUP3 when the twelfth core reception control signal CRC<12> is enabled at a logic high level.

The third transmitter 435 is turned on when the third core transfer control signal CTC<3> is enabled at a logic high level, for example. The third transmitter 435 receives the third comparison strobe signal CPDS3 and outputs the third comparison strobe signal CPDS3 as the third core strobe signal CDS3 when the third core transfer control signal CTC<3> is enabled at a logic high level.

The third delay amount for the third core delay control circuit 450 is based on the third code signal CODE3<1:4>. The third core delay control circuit 450 generates the third comparison strobe signal CPDS3 by delaying the seventh input strobe signal IDS7 by the third delay amount when the pulse of the control signal CTR is input. The third core delay control circuit 450 is implemented using the same circuit as the first core delay control circuit 250 illustrated in FIG. 8 and performs the same operations as the first core delay control circuit 250, except that the input and output signals of the third core delay control circuit 450 are different from the input and output signals of the first core delay control circuit 250.

The third core calibration circuit 470 initializes each of the bits of the third code signal CODE3<1:4> during the first training operation. The third core calibration circuit 470 generates the third code signal CODE3<1:4> by comparing the phase of the third comparison strobe signal CPDS3 with the phase of the eighth input strobe signal IDS8 and the phase of the ninth input strobe signal IDS9 during the second training operation. During the second training operation, the third core calibration circuit 470 changes a logic level combination of the third code signal CODE3<1:4> such that the phase of the third comparison strobe signal CPDS3, the phase of the eighth input strobe signal IDS8, and the phase of the ninth input strobe signal IDS9 are substantially similar or identical. The third core calibration circuit 470 increments the bits of the third code signal CODE3<1:4> when the third input update signal IUP3 is enabled during the third training operation. The third core calibration circuit 470 increments or decrements the values of the bits of the third code signal CODE3<1:4> when the third input update signal IUP3 is enabled during the third training operation. The third code signal CODE3<1:4> is generated having the same delay amount as the delay amount for each of the first signal path and the sixth signal path along which the strobe signal DQS and the third core strobe signal CDS3 are input and output. The third core calibration circuit 470 is implemented using the same circuit as the first core calibration circuit 270 illustrated in FIG. 9 to FIG. 11 and performs the same operations as the first core calibration circuit 270, except that the input and output signals of the third core calibration circuit 470 are different from the input and output signals of the first core calibration circuit 270.

The third core calibration circuit 470 according to an embodiment initializes each of the bits of the third code signal CODE3<1:4> at a logic low level during the first training operation. The third core calibration circuit 470 sequentially increments the bits of the third code signal CODE3<1:4> during the second training operation. The third core calibration circuit 470 sequentially increments the bits of the third code signal CODE3<1:4> until each of the bits of the third code signal CODE3<1:4> is generated at a logic high level during the second training operation. The third core calibration circuit 470 stores the generated third code signal CODE3<1:4> when the third update signal UPD<3> is disabled at a logic low level during the third training operation.

The third memory circuit 490 is implemented with a common memory cell array including a plurality of memory cells (not illustrated). The third memory circuit 490 outputs third data DATA3 stored in the plurality of memory cells, in synchronization with the third comparison strobe signal CPDS3 after the start of a read operation. The third memory circuit 490 stores the third data DATA3 in the plurality of memory cells in synchronization with the third comparison strobe signal CPDS3 after the start of a write operation. The third data DATA3 may be common data including a plurality of bits.

Figure 14:
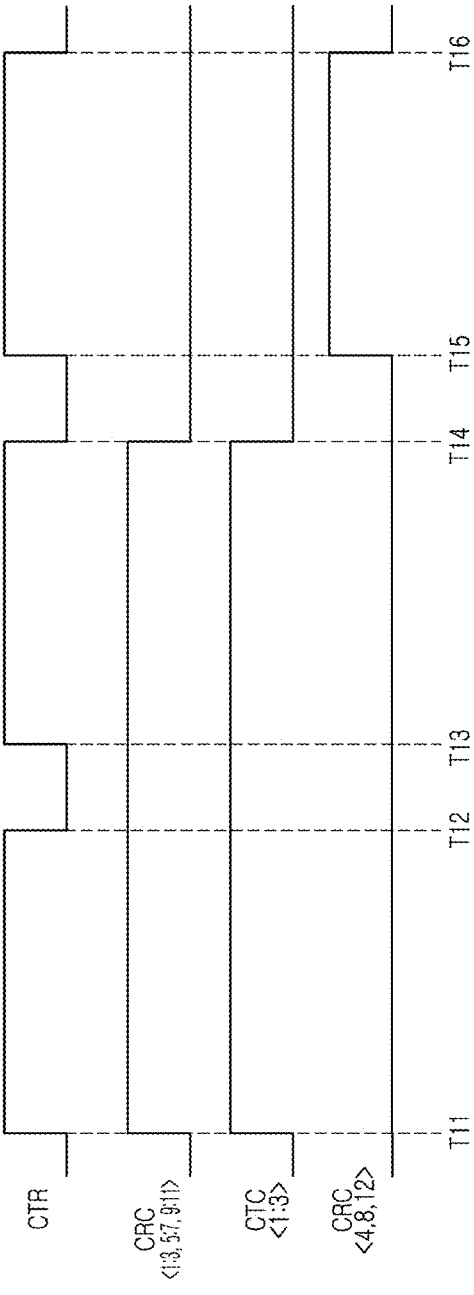
FIG. 14 is a timing diagram during operation of a first core control circuit, a second core control circuit, and a third core control circuit according to an embodiment of the present disclosure.

FIG. 14 is a timing diagram during operation of the first core control circuit 210, the second core control circuit 310, and the third core control circuit 410, for example, as illustrated in FIG. 7, FIG. 12, and FIG. 13. Operations including generating, by the first core control circuit 210, the second core control circuit 310, and the third core control circuit 410, the first to twelfth core reception control signals CRC<1:12> and the first to third core transfer control signals CTC<1:3> that control the first receiver 231 to the twelfth receiver 434 and the first transmitter 235 to third transmitter 435 during the first to third training operations are described as an example with reference to FIG. 14.

At time T11, the first core control circuit 210 of the first core chip 30 generates the first to third core reception control signals CRC<1:3> that are enabled at a logic high level when the first pulse of the control signal CTR is input.

The second core control circuit 310 of the second core chip generates the fifth to seventh core reception control signals CRC<5:7> that are enabled at a logic high level when the first pulse of the control signal CTR is input.

The third core control circuit 410 of the third core chip 50 generates the ninth to eleventh core reception control signals CRC<9:11> that are enabled at a logic high level when the first pulse of the control signal CTR is input.

The first core control circuit 210 of the first core chip 30 generates the first core transfer control signal CTC<1> that is enabled at a logic high level when the first pulse of the control signal CTR is input.

The second core control circuit 310 of the second core chip generates the second core transfer control signal CTC<2> that is enabled at a logic high level when the first pulse of the control signal CTR is input.

The third core control circuit 410 of the third core chip 50 generates the third core transfer control signal CTC<3> that is enabled at a logic high level when the first pulse of the control signal CTR is input.

At time T12, the control signal CTR is input at a logic low level.

Time T11 through time T12 correspond to a time interval during which the first pulse of the control signal CTR is enabled at a logic high level during which time interval the first training operation is performed.

At time T13, the first core control circuit 210 of the first core chip 30 generates the first to third core reception control signals CRC<1:3> that are enabled at a logic high level when the second pulse of the control signal CTR is input.

The second core control circuit 310 of the second core chip 40 generates the fifth to seventh core reception control signals CRC<5:7> that are enabled at a logic high level when the second pulse of the control signal CTR is input.

The third core control circuit 410 of the third core chip 50 generates the ninth to eleventh core reception control signals CRC<9:11> that are enabled at a logic high level when the second pulse of the control signal CTR is input.

The first core control circuit 210 of the first core chip 30 generates the first core transfer control signal CTC<1> that is enabled at a logic high level while the second pulse of the control signal CTR is input at a logic high level.

The second core control circuit 310 of the second core chip generates the second core transfer control signal CTC<2> that is enabled at a logic high level while the second pulse of the control signal CTR is input at a logic high level.

The third core control circuit 410 of the third core chip 50 generates the third core transfer control signal CTC<3> that is enabled at a logic high level while the second pulse of the control signal CTR is input at a logic high level.

At time T14, the control signal CTR is input at a logic low level.

Time T13 through time T14 correspond to a time interval during which the second pulse of the control signal CTR is enabled at a logic high level during which time interval the second training operation is performed.

At time T15, the first core control circuit 210 of the first core chip 30 generates the fourth core reception control signal CRC<4> enabled at a logic high level when the third pulse of the control signal CTR is input.

The second core control circuit 310 of the second core chip generates the eighth core reception control signal CRC<8> enabled at a logic high level when the third pulse of the control signal CTR is input.

The third core control circuit 410 of the third core chip 50 generates the twelfth core reception control signal CRC<12> enabled at a logic high level when the third pulse of the control signal CTR is input.

At time T16, the control signal CTR is input at a logic low level.

Time T15 through time T16 correspond to a time interval during which the third pulse of the control signal CTR is enabled at a logic high level during which time interval the third training operation is performed.

Figure 15:
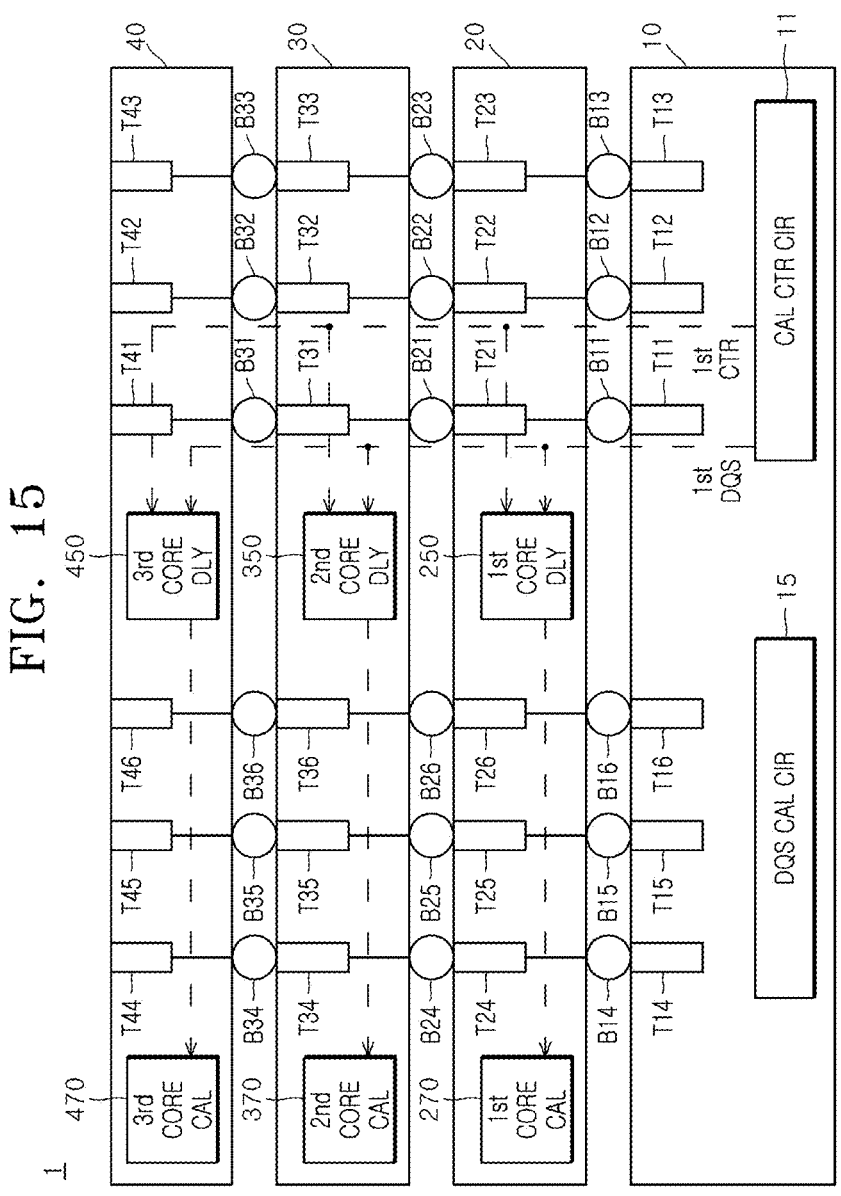
FIG. 15 to FIG. 17 are diagrams of a semiconductor device during a first training operation, a second training operation, and a third training operation according to an embodiment of the present disclosure.
Figure 16:
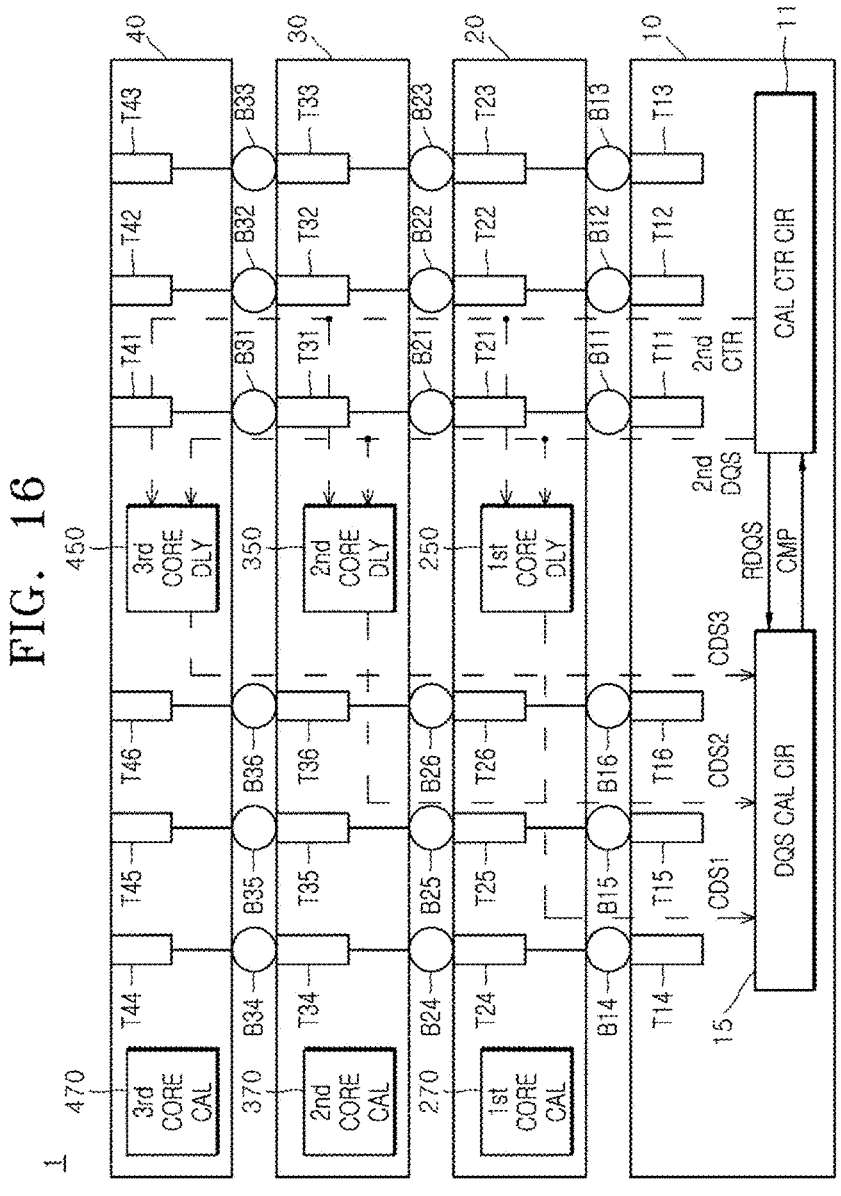
Figure 17:
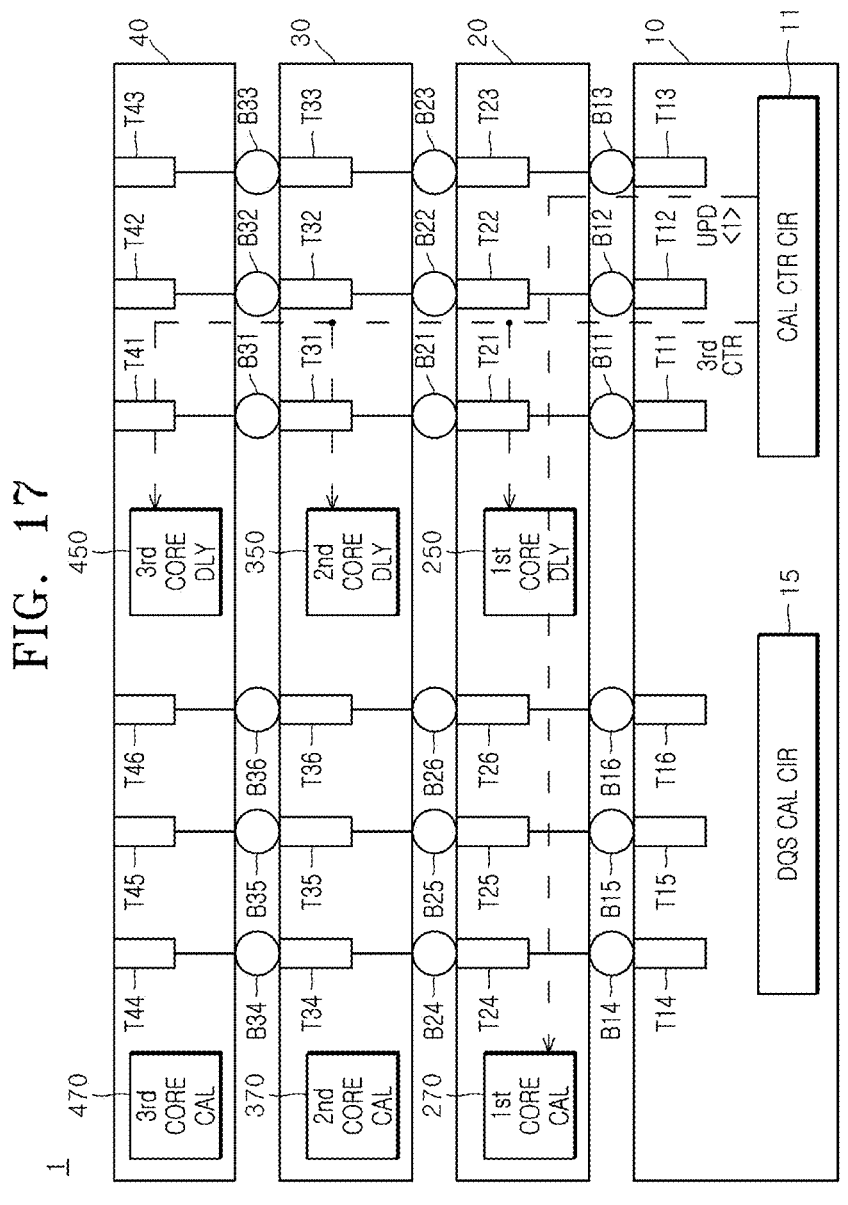

FIG. 15 to FIG. 17 are diagrams of the semiconductor device 1 during a first training operation, a second training operation, and a third training operation according to an embodiment of the present disclosure.

The first training operation of the semiconductor device 1 is described with reference to FIG. 15.

The calibration control circuit 11 of the base chip 10 generates the reference strobe signal RDQS that is periodically toggled and the first pulse of the pulse signal PUL when the test mode signal TM is enabled after the start of the first training operation.

The base input and output circuit 13 of the base chip 10 outputs the reference strobe signal RDQS as the strobe signal DQS to the first signal path. The base input and output circuit 13 outputs the first pulse of the pulse signal PUL as the first pulse of the control signal CTR to the second signal path.

The first core calibration circuit 270 of the first core chip 20 initializes each of the bits of the first code signal CODE1<1:4> when the first pulse of the control signal CTR is input to the second signal path.

The first core delay control circuit 250 of the first core chip determines the first delay amount based on the bits of the first code signal CODE1<1:4>. The first core delay control circuit 250 generates the first comparison strobe signal CPDS1 by delaying, by the first delay amount, the first input strobe signal IDS1 generated from the strobe signal DQS that is input to the first signal path when the first pulse of the control signal CTR is input.

The second core calibration circuit 370 of the second core chip 30 initializes each of the bits of the second code signal CODE2<1:4> when the first pulse of the control signal CTR is input to the second signal path.

The second core delay control circuit 350 of the second core chip 30 determines the second delay amount based on the bits of the second code signal CODE2<1:4>. The second core delay control circuit 350 generates the second comparison strobe signal CPDS2 by delaying, by the second delay amount, the fourth input strobe signal IDS4 generated from the strobe signal DQS when the first pulse of the control signal CTR is input.

The third core calibration circuit 470 of the third core chip initializes the bits of the third code signal CODE3<1:4> when the first pulse of the control signal CTR is input to the second signal path.

The third core delay control circuit 450 of the third core chip determines the third delay amount based on all the bits of the third code signal CODE3<1:4>. The third core delay control circuit 450 generates the third comparison strobe signal CPDS3 by delaying, by the third delay amount, the seventh input strobe signal IDS7 generated from the strobe signal DQS when the first pulse of the control signal CTR is input.

The second training operation of the semiconductor device 1 is described with reference to FIG. 16.

The calibration control circuit 11 of the base chip 10 generates the reference strobe signal RDQS that is periodically toggled and the second pulse of the pulse signal PUL when the test mode signal TM is enabled after the start of the second training operation.

The base input and output circuit 13 of the base chip 10 outputs the reference strobe signal RDQS as the strobe signal DQS to the first signal path. The base input and output circuit 13 outputs the second pulse of the pulse signal PUL as the second pulse of the control signal CTR to the second signal path.

The first core delay control circuit 250 of the first core chip determines the first delay amount based on the first code signal CODE1<1:4>. The first core delay control circuit 250 generates the first comparison strobe signal CPDS1 by delaying, by the first delay amount, the first input strobe signal IDS1 generated from the strobe signal DQS when the second pulse of the control signal CTR is input.

The second core strobe signal CDS2 is input to the first core calibration circuit 270 via the fifth signal path. The third core strobe signal CDS3 is input to the first core calibration circuit 270 via the sixth signal path.

The first core calibration circuit 270 of the first core chip 20 generates the first code signal CODE1<1:4> by comparing the phase of the first comparison strobe signal CPDS1 with the phase of the second input strobe signal IDS2 generated from the second core strobe signal CDS2 and the phase of the third input strobe signal IDS3 generated from the third core strobe signal CDS3 during the second training operation. The first core calibration circuit 270 changes a logic level combination of the first code signal CODE1<1:4> such that the phase of the first comparison strobe signal CPDS1, the phase of the second input strobe signal IDS2, and the phase of the third input strobe signal IDS3 are substantially similar or identical during the second training operation.

The first core input and output circuit 230 of the first core chip 20 receives the first comparison strobe signal CPDS1 and outputs the first comparison strobe signal CPDS1 as the first core strobe signal CDS1 to the fourth signal path.

The second core delay control circuit 350 of the second core chip 40 sets the second delay amount based on the second code signal CODE2<1:4>. The second core delay control circuit 350 generates the second comparison strobe signal CPDS2 by delaying, by the second delay amount, the fourth input strobe signal IDS4 generated from the strobe signal DQS when the second pulse of the control signal CTR is input.

The first core strobe signal CDS1 is input to the second core calibration circuit 370 via the fourth signal path. The third core strobe signal CDS3 is input to the second core calibration circuit 370 via the sixth signal path.

The second core calibration circuit 370 of the second core chip 30 generates the second code signal CODE2<1:4> by comparing the phase of the second comparison strobe signal CPDS2 with the phase of the fifth input strobe signal IDS5 generated from the first core strobe signal CDS1 and the phase of the sixth input strobe signal IDS6 generated from the third core strobe signal CDS3 during the second training operation. The second core calibration circuit 370 changes a logic level combination of the second code signal CODE2<1:4> such that the phase of the second comparison strobe signal CPDS2, the phase of the fifth input strobe signal IDS5, and the phase of the sixth input strobe signal IDS6 are substantially similar or identical during the second training operation.

The second core input and output circuit 330 of the second core chip 30 receives the second comparison strobe signal CPDS2 and outputs the second comparison strobe signal CPDS2 as the second core strobe signal CDS2 via the fifth signal path.

The third core delay control circuit 450 of the third core chip determines the third delay amount based on the third code signal CODE3<1:4>. The third core delay control circuit 450 generates the third comparison strobe signal CPDS3 by delaying, by the third delay amount, the seventh input strobe signal IDS7 generated from the strobe signal DQS when the second pulse of the control signal CTR is input.

The first core strobe signal CDS1 is input to the third core calibration circuit 470 via the fourth signal path. The second core strobe signal CDS2 is input to the third core calibration circuit 470 via the fifth signal path.

The third core calibration circuit 470 of the third core chip generates the third code signal CODE3<1:4> by comparing the phase of the third comparison strobe signal CPDS3 with the phase of the eighth input strobe signal IDS8 generated from the first core strobe signal CDS1 and the phase of the ninth input strobe signal IDS9 generated from the second core strobe signal CDS2 during the second training operation. The third core calibration circuit 470 changes a logic level combination of the third code signal CODE3<1:4> such that the phase of the third comparison strobe signal CPDS3, the phase of the eighth input strobe signal IDS8, and the phase of the ninth input strobe signal IDS9 are substantially similar or identical during the second training operation.

The third core input and output circuit 430 of the third core chip 40 receives the third comparison strobe signal CPDS3 and outputs the third comparison strobe signal CPDS3 as the third core strobe signal CDS3 to the sixth signal path.

When the calibration enable signal CEN is enabled after the start of the second training operation, the strobe signal calibration circuit 15 of the base chip 10 generates the comparison signal CMP by comparing the phase of the first core strobe signal CDS1, the phase of the second core strobe signal CDS2, and the phase of the third core strobe signal CDS3 with the phase of the reference strobe signal RDQS. In this example, the strobe signal calibration circuit 15 generates the comparison signal CMP that is enabled at a logic high level when the phase of the first core strobe signal CDS1, the phase of the second core strobe signal CDS2, the phase of the third core strobe signal CDS3, are different from the phase of the reference strobe signal RDQS. The strobe signal calibration circuit 15 generates the comparison signal CMP that is disabled at a logic low level when the phase of the first core strobe signal CDS1, the phase of the second core strobe signal CDS2, the phase of the third core strobe signal CDS3, and the phase of the reference strobe signal RDQS are substantially similar or identical.

The third training operation of the semiconductor device 1 is described with reference to FIG. 17. In this example, an operation of updating, by the first core chip 20, the first code signal CODE1<1:4> is described as an example.

The calibration control circuit 11 of the base chip 10 generates the reference strobe signal RDQS at a constant logic level and the third pulse of the pulse signal PUL when the test mode signal TM is enabled after the start of the third training operation. The calibration control circuit 11 generates the first addition signal AD<1> that is enabled at a logic high level based on the comparison signal CMP that is enabled at a logic high level when the phase of the first core strobe signal CDS1 is different from the phase of the reference strobe signal RDQS during the second training operation.

The base input and output circuit 13 of the base chip 10 outputs the third pulse of the pulse signal PUL as the third pulse of the control signal CTR to the second signal path. The base input and output circuit 13 outputs the first addition signal AD<1> as the first update signal UPD<1>.

The first core calibration circuit 270 of the first core chip 20 increments one time the bits of the first code signal CODE1<1:4> generated after the start of the second training operation upon input of the first update signal UPD<1> to the third signal path.

The first core delay control circuit 250 of the first core chip 20 determines the first delay amount based on the bits of the first code signal CODE1<1:4> that are incremented once. The first core delay control circuit 250 generates the first comparison strobe signal CPDS1 by delaying, by the first delay amount, the first input strobe signal IDS1 generated from the strobe signal DQS input to the first signal path when the third pulse of the control signal CTR is input.

The second core delay control circuit 350 of the second core chip 30 maintains the second delay amount based on the second code signal CODE2<1:4> generated after the start of the second training operation.

The third core delay control circuit 450 of the third core chip maintains the third delay amount based on the third code signal CODE3<1:4> generated after the start of the second training operation.

As described, the semiconductor device 1 according to an embodiment of the present disclosure, may additionally perform a training operation on the strobe signal DQS after performing a training operation on the strobe signal DQS within each of a plurality of core chips. After performing the training operation on the strobe signal DQS, the semiconductor device 1 may calibrate the delay amounts of the strobe signals DQS used in each of the plurality of core chips by additionally performing a training operation on the strobe signal DQS in the base chip. The semiconductor device 1 can prevent a fail in a data input and output operation by additionally performing a training operation on the strobe signal DQS after performing a training operation on the strobe signal DQS within each of the plurality of core chips.

Figure 18:
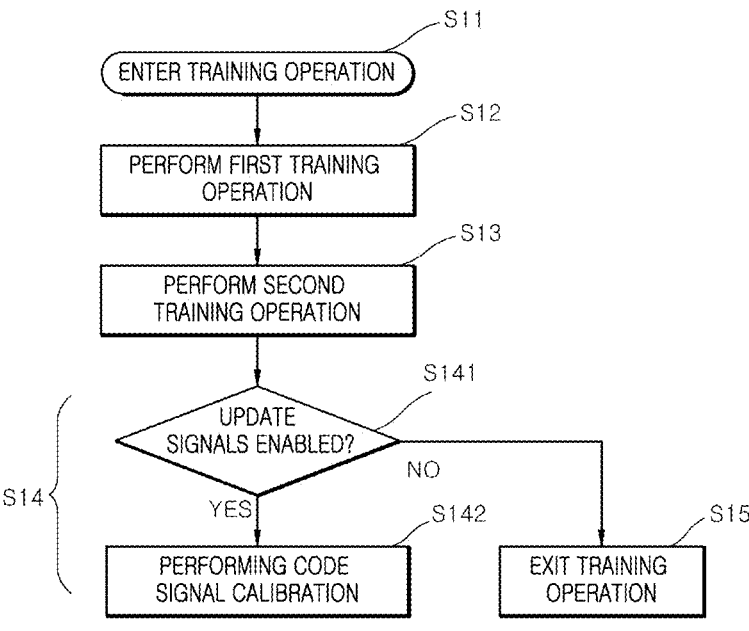
FIG. 18 is a flowchart illustrating a strobe signal training method according to an embodiment of the present disclosure.

FIG. 18 is a flowchart illustrating a strobe signal training method according to an embodiment of the present disclosure.

In an embodiment, the strobe signal training method includes entering training operation S11, performing a first training operation S12, performing a second training operation S13, performing a third training operation S14, and exiting training operation S15. The processes of the flowchart may be performed in a different order and may include fewer or additional processes than described and shown in FIG. 18.

A training operation entry process S11 includes entering first to third training operations. During the training opera-
tion entry process S11, the test mode signal TM is enabled at a logic high level, for example.

The first training operation S12 includes generating the strobe signal DQS that is periodically toggled and the first pulse of the control signal CTR to enter the first training operation in the base chip 10. The first training operation S12 includes initializing the first code signal CODE1<1:4> in the first core chip 20. The first training operation S12 includes initializing the second code signal CODE2<1:4> in the second core chip 30. The first training operation S12 includes initializing the third code signal CODE3<1:4> in the third core chip 40.

During the first training operation S12, the base input and output circuit 13 of the base chip 10 outputs the reference strobe signal RDQS as the strobe signal DQS to the first signal path. During the first training operation S12, the base input and output circuit 13 outputs the first pulse of the pulse signal PUL as the first pulse for the control signal CTR to the second signal path.

During the first training operation S12, the first core calibration circuit 270 of the first core chip 20 initializes each of the bits of the first code signal CODE1<1:4> when the first pulse of the control signal CTR is input to the second signal path. During the first training operation S12, the first core delay control circuit 250 of the first core chip 20 determines the first delay amount based on the first code signal CODE1<1:4>. The first core delay control circuit 250 generates the first comparison strobe signal CPDS1 by delaying, by the first delay amount, the first input strobe signal IDS1 generated from the strobe signal DQS input to the first signal path when the first pulse of the control signal CTR is input.

While performing the first training operation S12, the second core calibration circuit 370 of the second core chip 30 initializes each of the bits of the second code signal CODE2<1:4> when the first pulse of the control signal CTR is input to the second signal path. The second core delay control circuit 350 of the second core chip 30 determines the second delay amount based on the second code signal CODE2<1:4>. The second core delay control circuit 350 generates the second comparison strobe signal CPDS2 by delaying, by the second delay amount, the fourth input strobe signal IDS4 generated from the strobe signal DQS when the first pulse of the control signal CTR is input.

While performing the first training operation S12, the third core calibration circuit 470 of the third core chip 40 initializes each of the bits of the third code signal CODE3<1:4> when the first pulse of the control signal CTR is input to the second signal path. The third core delay control circuit 450 of the third core chip 40 determines the third delay amount based on the third code signal CODE3<1:4>. The third core delay control circuit 450 generates the third comparison strobe signal CPDS3 by delaying, by the third delay amount, the seventh input strobe signal IDS7 generated from the strobe signal DQS when the first pulse of the control signal CTR is input.

Performing the second training operation S13 includes generating the strobe signal DQS that is periodically toggled and the second pulse of the control signal CTR to enter the second training operation in the base chip 10. Performing the second training operation S13 includes changing a logic level combination of the first code signal CODE1<1:4> in the first core chip 20. Performing the second training operation S13 includes changing a logic level combination of the second code signal CODE2<1:4> in the second core chip 30. Performing the second training operation S13 includes changing a logic level combination of the third code signal CODE3<1:4> in the third core chip 30.

While performing the second training operation S13, the base input and output circuit 13 of the base chip 10 outputs the reference strobe signal RDQS as the strobe signal DQS to the first signal path. The base input and output circuit 13 outputs the second pulse of the pulse signal PUL as the second pulse of the control signal CTR to the second signal path.

During the second training operation S13, the first core delay control circuit 250 of the first core chip 20 determines the first delay amount based on the first code signal CODE1<1:4>. The first core delay control circuit 250 generates the first comparison strobe signal CPDS1 by delaying, by the first delay amount, the first input strobe signal IDS1 generated from the strobe signal DQS when the second pulse of the control signal CTR is input. The first core calibration circuit 270 of the first core chip 20 generates the first code signal CODE1<1:4> by comparing the phase of the first comparison strobe signal CPDS1 with the phase of the second input strobe signal IDS2 from the second core strobe signal CDS2 and the phase of the third input strobe signal IDS3 generated from the third core strobe signal CDS3. The first core calibration circuit 270 changes a logic level combination of the first code signal CODE1<1:4> such that the phase of the first comparison strobe signal CPDS1, the phase of the second input strobe signal IDS2, and the phase of the third input strobe signal IDS3 are substantially similar or identical. The first core input and output circuit 230 of the first core chip 20 receives the first comparison strobe signal CPDS1 and outputs the first comparison strobe signal CPDS1 as the first core strobe signal CDS1 via the fourth signal path.

During the second training operation S13, the second core delay control circuit 350 of the second core chip 40 determines the second delay amount based on the second code signal CODE2<1:4>. The second core delay control circuit 350 generates the second comparison strobe signal CPDS2 by delaying, by the second delay amount, the fourth input strobe signal IDS4 generated from the strobe signal DQS when the second pulse of the control signal CTR is input. The second core calibration circuit 370 of the second core chip 30 generates the second code signal CODE2<1:4> by comparing the phase of the second comparison strobe signal CPDS2 with the phase of the fifth input strobe signal IDS5 generated from the first core strobe signal CDS1 and the phase of the sixth input strobe signal IDS6 generated from the third core strobe signal CDS3. The second core calibration circuit 370 changes a logic level combination of the second code signal CODE2<1:4> such that the phase of the second comparison strobe signal CPDS2, the phase of the fifth input strobe signal IDS5, and the phase of the sixth input strobe signal IDS6 are substantially similar or identical during the second training operation. The second core input and output circuit 330 of the second core chip 30 receives the second comparison strobe signal CPDS2 and outputs the second comparison strobe signal CPDS2 as the second core strobe signal CDS2 via the fifth signal path.

During the second training operation S13, the third core delay control circuit 450 of the third core chip 40 determines the third delay amount based on the third code signal CODE3<1:4>. The third core delay control circuit 450 generates the third comparison strobe signal CPDS3 by delaying, by the third delay amount, the seventh input strobe signal IDS7 generated from the strobe signal DQS when the second pulse of the control signal CTR is input. The third core calibration circuit 470 of the third core chip 40 generates the third code signal CODE3<1:4> by comparing the phase of the third comparison strobe signal CPDS3 with the phase of the eighth input strobe signal IDS8 generated from the first core strobe signal CDS1 and the phase of the ninth input strobe signal IDS9 generated from the second core strobe signal CDS2 during the second training operation. The third core calibration circuit 470 changes a logic level combination of the third code signal CODE3<1:4> such that the phase of the third comparison strobe signal CPDS3, the phase of the eighth input strobe signal IDS8, and the phase of the ninth input strobe signal IDS9 are substantially similar or identical during the second training operation. The third core input and output circuit 430 of the third core chip 40 receives the third comparison strobe signal CPDS3 and outputs the third comparison strobe signal CPDS3 as the third core strobe signal CDS3 to the sixth signal path.

During the second training operation S13, the strobe signal calibration circuit 15 of the base chip 10 generates the comparison signal CMP by comparing the phase of the first core strobe signal CDS1, the phase of the second core strobe signal CDS2, and the phase of the third core strobe signal CDS3 with the phase of the reference strobe signal RDQS when the calibration enable signal CEN is enabled after the start of the second training operation. In this example, the strobe signal calibration circuit 15 generates the comparison signal CMP enabled at a logic high level when the phase of the first core strobe signal CDS1, the phase of the second core strobe signal CDS2, and the phase of the third core strobe signal CDS3, are different from the phase of the reference strobe signal RDQS. The strobe signal calibration circuit 15 generates the comparison signal CMP disabled at a logic low level when the phase of the first core strobe signal CDS1, the phase of the second core strobe signal CDS2, the phase of the third core strobe signal CDS3, and the phase of the reference strobe signal RDQS are substantially similar or identical.

In an embodiment, the third training operation S14 includes performing an update determination S141 and performing a code signal calibration S142.

When the comparison signal CMP is at a logic low level, the first to third update signals UPD<1:3> are generated as enabled S141.

During update determination S141, the calibration control circuit 11 of the base chip 10 generates the reference strobe signal RDQS at a constant logic level and the third pulse of the pulse signal PUL. The calibration control circuit 11 generates the first to third addition signals AD<1:3> enabled at a logic high level when the comparison signal CMP is enabled at a logic high level during the second training operation. The base input and output circuit 13 of the base chip 10 outputs the third pulse of the pulse signal PUL as the third pulse of the control signal CTR. The base input and output circuit 13 outputs the first to third addition signals AD<1:3> as the first to third update signals UPD<1:3>. When the first to third update signals UPD<1:3> are enabled (YES) during update determination S141, code signal calibration S142 is performed. When the first to third update signals UPD<1:3> are disabled (NO) during update determination S141, training operation termination S15 is performed.

Code signal calibration S142 includes incrementing the first code signal CODE1<1:4> of the first core chip 20 based on the first update signal UPD<1>, incrementing the second code signal CODE2<1:4> of the second core chip 30 based on the second update signal UPD<2>, and incrementing the third code signal CODE3<1:4> of the third core chip 40 based on the third update signal UPD<3>.

During code signal calibration S142, the first core calibration circuit 270 of the first core chip 20 generates the first code signal CODE1<1:4> by incrementing the bits of the first code signal CODE1<1:4> upon input of the first update signal UPD<1> at a logic high level after the start of the second training operation. The second core calibration circuit 370 of the second core chip 30 generates the second code signal CODE2<1:4> by incrementing the bits of the second code signal CODE2<1:4> upon input of the second update signal UPD<2> at a logic high level after the start of the second training operation. The third core calibration circuit 470 of the third core chip generates the third code signal CODE3<1:4> by incrementing the bits of the third code signal CODE3<1:4> upon input of the third update signal UPD<3> at a logic high level after the start of the second training operation.

Performing training operation termination S15 includes terminating the first to third training operations.

During the strobe signal training method, a training operation may be performed on the strobe signal DQS after a training operation is performed on the strobe signal DQS within each of a plurality of core chips. During the strobe signal training method, after the training operation is performed on the strobe signal DQS, the delay amounts of the strobe signals DQS that are used in the plurality of core chips may be calibrated by additionally performing a training operation on the strobe signal DQS in the base chip. The strobe signal training method may prevent a failure in data input and output operation by additionally performing a training operation on the strobe signal DQS after performing a training operation on the strobe signal DQS within each of the plurality of core chips.

Figure 19:
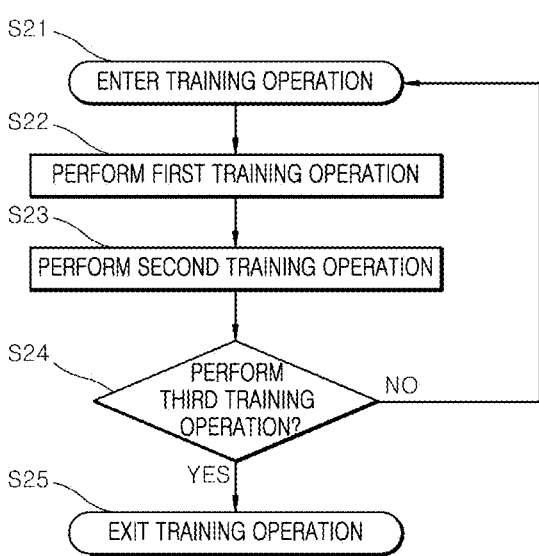
FIG. 19 is a flowchart illustrating a strobe signal training method according to an embodiment of the present disclosure.

FIG. 19 is a flowchart illustrating a strobe signal training method according to an embodiment of the present disclosure. The processes of the flowchart may be performed in a different order and may include fewer or additional processes than described and shown in FIG. 19.

In an embodiment, the strobe signal training method includes entering a training operation S21, performing a first training operation S22, performing a second training operation S23, performing a third training operation S24, and exiting training operation S25.

Entering training operation S21 includes entering first to third training operations. During training operation entry S21, the test mode signal TM is enabled at a logic high level.

Performing the first training operation S22 includes generating the strobe signal DQS that is periodically toggled and the first pulse of the control signal CTR to enter the first training operation in the base chip 10. Performing the first training operation S22 includes initializing each of the bits of the first code signal CODE1<1:4> at a logic low level in the first core chip 20. Performing the first training operation S22 includes initializing each of the bits of the second code signal CODE2<1:4> at a logic low level in the second core chip 30. Performing the first training operation S22 includes initializing each of the bits of the third code signal CODE3<1:4> at a logic low level in the third core chip 40.

Performing the first training operation S22, the base input and output circuit 13 of the base chip 10 outputs the reference strobe signal RDQS as the strobe signal DQS to the first signal path. While performing the first training operation S22, the base input and output circuit 13 outputs the first pulse of the pulse signal PUL as the first pulse for the control signal CTR to the second signal path.

While performing the first training operation S22, the first core calibration circuit 270 of the first core chip 20 initializes each of the bits of the first code signal CODE1<1:4> at a logic low level when the first pulse of the control signal CTR is input to the second signal path. While performing the first training operation S22, the first core delay control circuit 250 of the first core chip 20 determines the first delay amount based on the first code signal CODE1<1:4>. The first core delay control circuit 250 generates the first comparison strobe signal CPDS1 by delaying, by the first delay amount, the first input strobe signal IDS1 generated from the strobe signal DQS input to the first signal path when the first pulse of the control signal CTR is input.

During the first training operation S22, the second core calibration circuit 370 of the second core chip 30 initializes each of the bits of the second code signal CODE2<1:4> at a logic low level when the first pulse of the control signal CTR is input to the second signal path. The second core delay control circuit 350 of the second core chip sets the second delay amount based on the second code signal CODE2<1:4>. The second core delay control circuit 350 generates the second comparison strobe signal CPDS2 by delaying, by the second delay amount, the fourth input strobe signal IDS4 generated from the strobe signal DQS when the first pulse of the control signal CTR is input.

During the first training operation S22, the third core calibration circuit 470 of the third core chip 40 initializes each of the bits of the third code signal CODE3<1:4> at a logic low level when the first pulse of the control signal CTR is input to the second signal path. The third core delay control circuit 450 of the third core chip 40 determines the third delay amount based on the third code signal CODE3<1:4>. The third core delay control circuit 450 generates the third comparison strobe signal CPDS3 by delaying, by the third delay amount, the seventh input strobe signal IDS7 generated from the strobe signal DQS when the first pulse of the control signal CTR is input.

Performing the second training operation S23 includes generating the strobe signal DQS that is periodically toggled and the second pulse of the control signal CTR to enter the second training operation in the base chip 10. Performing the second training operation S23 includes sequentially incrementing the bits of the first code signal CODE1<1:4> in the first core chip 20. Performing the second training operation S23 includes sequentially incrementing the bits of the second code signal CODE2<1:4> in the second core chip 30. Performing the second training operation S23 includes sequentially incrementing the bits of the third code signal CODE3<1:4> in the third core chip 30.

During the second training operation S23, the base input and output circuit 13 of the base chip 10 outputs the reference strobe signal RDQS as the strobe signal DQS to the first signal path. The base input and output circuit 13 outputs the second pulse of the pulse signal PUL as the second pulse of the control signal CTR to the second signal path.

During the second training operation S23, the first core delay control circuit 250 of the first core chip 20 determines the first delay amount based on the first code signal CODE1<1:4>. The first core delay control circuit 250 generates the first comparison strobe signal CPDS1 by delaying, by the first delay amount, the first input strobe signal IDS1 generated from the strobe signal DQS when the second pulse of the control signal CTR is input. The first core calibration circuit 270 of the first core chip 20 sequentially increments the bits of the first code signal CODE1<1:4>. In this example, the first core calibration circuit 270 sequentially increments the bits of the first code signal CODE1<1:4> until each of the bits of the first code signal CODE1<1:4> is generated at a logic high level. The first core input and output circuit 230 of the first core chip 20 receives the first comparison strobe signal CPDS1 and outputs the first comparison strobe signal CPDS1 as the first core strobe signal CDS1 to the fourth signal path.

During the second training operation S23, the second core delay control circuit 350 of the second core chip 40 determines the second delay amount based on the second code signal CODE2<1:4>. The second core delay control circuit 350 generates the second comparison strobe signal CPDS2 by delaying, by the second delay amount, the fourth input strobe signal IDS4 generated from the strobe signal DQS when the second pulse of the control signal CTR is input. The second core calibration circuit 370 of the second core chip 30 sequentially increments the bits of the second code signal CODE2<1:4>. In this example, the second core calibration circuit 370 sequentially increments the bits of the second code signal CODE2<1:4> until each of the bits of the second code signal CODE2<1:4> is generated at a logic high level. The second core input and output circuit 330 of the second core chip 30 receives the second comparison strobe signal CPDS2 and outputs the second comparison strobe signal CPDS2 as the second core strobe signal CDS2 via the fifth signal path.

During the second training operation S23, the third core delay control circuit 450 of the third core chip 40 determines the third delay amount based on the third code signal CODE3<1:4>. The third core delay control circuit 450 generates the third comparison strobe signal CPDS3 by delaying, by the third delay amount, the seventh input strobe signal IDS7 generated from the strobe signal DQS when the second pulse of the control signal CTR is input. The third core calibration circuit 470 of the third core chip 40 sequentially increments the bits of the third code signal CODE3<1:4>. In this example, the third core calibration circuit 470 sequentially increments the bits of the third code signal CODE3<1:4> until each of the bits of the third code signal CODE3<1:4> is generated at a logic high level. The third core input and output circuit 430 of the third core chip 40 receives the third comparison strobe signal CPDS3 and outputs the third comparison strobe signal CPDS3 as the third core strobe signal CDS3 at the sixth signal path.

When the calibration enable signal CEN is enabled after the start of the second training operation S23, the strobe signal calibration circuit 15 of the base chip 10 generates the comparison signal CMP by comparing the phase of the first core strobe signal CDS1, the phase of the second core strobe signal CDS2, and the phase of the third core strobe signal CDS3 with the phase of the reference strobe signal RDQS. In this example, the strobe signal calibration circuit 15 generates the comparison signal CMP that is enabled at a logic high level when the phase of the first core strobe signal CDS1, the phase of the second core strobe signal CDS2, and the phase of the third core strobe signal CDS3 are different from the phase of the reference strobe signal RDQS. The strobe signal calibration circuit 15 generates the comparison signal CMP that is disabled at a logic low level when the phase of the first core strobe signal CDS1, the phase of the second core strobe signal CDS2, the phase of the third core strobe signal CDS3, and the phase of the reference strobe signal RDQS are substantially similar or identical.

Performing the third training operation S24 includes controlling the values of the first code signal CODE1<1:4>, the second code signal CODE2<1:4>, and the third code signal CODE3<1:4>.

While performing the third training operation S24, the calibration control circuit 11 of the base chip 10 generates the reference strobe signal RDQS at a constant logic level and the third pulse of the pulse signal PUL. The calibration control circuit 11 generates the first to third addition signals AD<1:3> enabled at a logic high level when the comparison signal CMP is enabled at a logic high level during the second training operation. The base input and output circuit 13 of the base chip 10 outputs the third pulse of the pulse signal PUL as the third pulse of the control signal CTR. The base input and output circuit 13 outputs the first to third addition signals AD<1:3> as the first to third update signals UPD<1:3>.

During the third training operation S24, the first core calibration circuit 270 of the first core chip 20 sequentially increments the bits of the first code signal CODE1<1:4> while the first update signal UPD<1> is enabled. During the third training operation S24, the first core calibration circuit 270 of the first core chip 20 stores the generated first code signal CODE1<1:4> when the first update signal UPD<1> is disabled at a logic low level. The first core delay control circuit 250 of the first core chip 20 determines the first delay amount based on the first code signal CODE1<1:4> that is stored. During the third training operation S24, the first core calibration circuit 270 of the first core chip 20 increments the bits of the first code signal CODE1<1:4> until each of the combinations of the bits of the first code signal CODE1<1:4> are cycled through or counted. After the first code signal CODE1<1:4> is stored (YES) in the third training operation S24, the training operation termination S25 is entered. After the bits of the first code signal CODE1<1:4> are sequentially incremented during the third training operation S24 (NO), the training operation S21 is entered.

During the third training operation S24, the second core calibration circuit 370 of the second core chip 30 sequentially increments the bits of the second code signal CODE2<1:4> while the second update signal UPD<2> is enabled. During the third training operation S24, the second core calibration circuit 370 of the second core chip 30 stores the second code signal CODE2<1:4> generated when the second update signal UPD<2> is disabled at a logic low level. The second core delay control circuit 350 of the second core chip 30 determines the second delay amount based on the second code signal CODE2<1:4> that is stored. During the third training operation S24, the second core calibration circuit 370 of the second core chip 30 increments the bits of the second code signal CODE2<1:4> until each of the combinations of the bits of the second code signal CODE2<1:4> are cycled through or incremented. After the second code signal CODE2<1:4> is stored (YES) in the third training operation S24, the training operation termination S25 is entered. After the bits of the second code signal CODE2<1:4> are sequentially incremented during the third training operation S24 (NO), the training operation entry process S21 is entered.

During the third training operation S24, the third core calibration circuit 470 of the third core chip 40 sequentially increments the bits of the third code signal CODE3<1:4> while the third update signal UPD<3> is enabled. During the third training operation S24, the third core calibration circuit 470 of the third core chip 40 stores the third code signal CODE3<1:4> generated when the third update signal UPD<3> is disabled at a logic low level. The third core delay control circuit 450 of the third core chip 40 determines the third delay amount based on the third code signal CODE3<1:4> that is stored. During the third training operation S24, the third core delay control circuit 450 of the third core chip 40 increments the bits of the third code signal CODE3<1:4> until each of the combinations of the bits of the third code signal CODE3<1:4> are cycled through or incremented. After the third code signal CODE3<1:4> is stored (YES) during the third training operation S24, training operation termination S25 is entered. After the bits of the third code signal CODE3<1:4> are sequentially incremented during the third training operation S24 (NO), the training operation S21 is entered.

Training operation termination S25 includes terminating the first to third training operations.

During the strobe signal training method, after the bits of the code signal that calibrate the delay amount of the strobe signal DQS are incremented within each of a plurality of core chips, the delay amount of the strobe signal DQS is calibrated. The strobe signal training method may prevent a failure during a training operation for the strobe signal DQS by fixing the delay amount of the strobe signal DQS after incrementing the bits of the code signal that calibrates the delay amount for the strobe signal DQS within each of the plurality of core chips.

Figure 20:
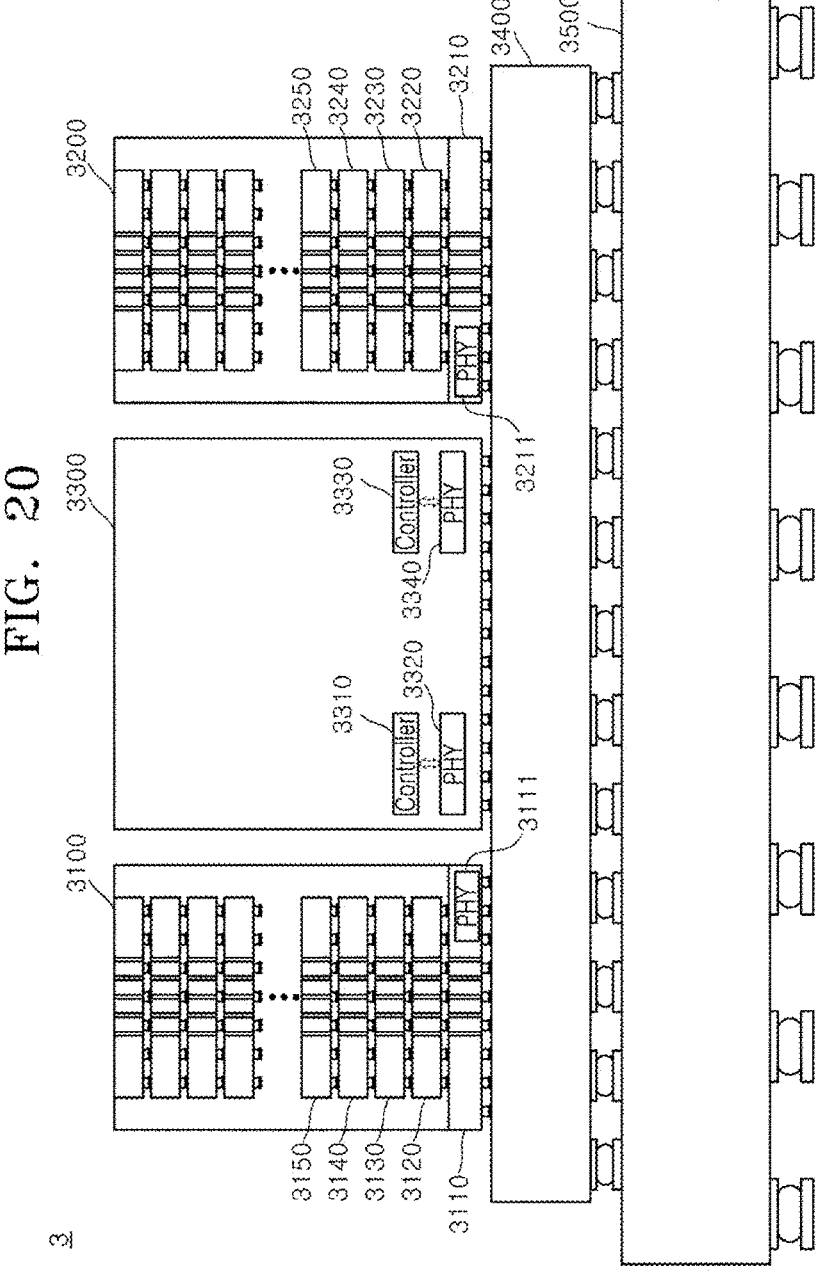

FIG. 20 is a block diagram illustrating a stack memory system 3 according to an embodiment of the present disclosure. As illustrated in FIG. 20, in an embodiment, the stack memory system 3 includes a first stack memory device 3100, a second stack memory device 3200, a processor 3300, an interposer 3400, and a board 3500.

The interposer 3400 is formed on or over the board 3500. The first stack memory device 3100, the second stack memory device 3200, and the processor 3300 are formed on or over the interposer 3400. The processor 3300 is formed between the first stack memory device 3100 and the second stack memory device 3200. The interposer 3400 electrically connects the board 3500, the first stack memory device 3100, the second stack memory device 3200, and the processor 3300. The first stack memory device 3100, the second stack memory device 3200, and the processor 3300 may be electrically connected to the interposer 3400 using wires that are variously formed because a difference between the pitches of the first stack memory device 3100, the second stack memory device 3200, and the processor 3300 is large.

In an embodiment, the processor 3300 includes a first controller 3310 that controls the first stack memory device 3100 and a first process interface circuit (PHY) 3320 that electrically connects the first stack memory device 3100 and the first controller 3310. In an embodiment, the processor 3300 includes a second controller 3330 that controls the second stack memory device 3200 and a second process interface circuit (PHY) 3340 that electrically connects the second stack memory device 3200 and the second controller 3330. The processor 3300 conveys, to the first stack memory device 3100, signals including a command and an address that control various internal operations of the first stack memory device 3100 through the first process interface circuit 3320 and receives signals from the first stack memory device 3100 through the first process interface circuit 3320. The processor 3300 conveys, to the second stack memory device 3200, signals including a command and an address that control various internal operations of the second stack memory device 3200 through the second process interface circuit 3340 and receives signals from the second stack memory device 3200 through the second process interface circuit 3340.

In an embodiment, the first stack memory device 3100 includes a first base chip 3110 and first core chips 3120, 3130, 3140, and 3150. The first stack memory device 3100 is implemented similarly to the semiconductor device 1 illustrated in FIG. 1. The first core chips 3120, 3130, 3140, and 3150 are stacked on or over the first base chip 3110 and receive various signals from the first base chip 3110 via through electrodes. The first stack memory device 3100 is formed to include the four first core chips 3120, 3130, 3140, and 3150, although a different quantity of core chips, such as 4, 8, and 16, may be stacked and formed within the first stack memory device 3100 according to an embodiment.

In an embodiment, the first base chip 3110 includes a first core interface circuit (PHY) 3111. The first core interface circuit 3111 communicates with the first processor interface circuit 3320, and receives signals transmitted by the processor 3300 and conveys, to the processor 3300, signals generated by the first core chips 3120, 3130, 3140, and 3150.

In an embodiment, the second stack memory device 3200 includes a second base chip 3210 and second core chips 3220, 3230, 3240, and 3250. The second stack memory device 3200 is implemented similarly to the semiconductor device 1 illustrated in FIG. 1. The second core chips 3220, 3230, 3240, and 3250 are stacked on or over the second base chip 3210 and receive various signals from the second base chip 3210 via through electrodes. The second stack memory device 3200 is formed to include the four second core chips 3220, 3230, 3240, and 3250, although a different quantity of core chips, such as 4, 8, and 16, may be stacked and formed within the second stack memory device 3200 according to an embodiment.

In an embodiment, the second base chip 3210 includes a second core interface circuit (PHY) 3211. The second core interface circuit 3211 communicates with the second processor interface circuit 3330 and receives signals transmitted by the processor 3300 and conveys, to the processor 3300, signals generated by the second core chips 3220, 3230, 3240, and 3250.

Figure 21:
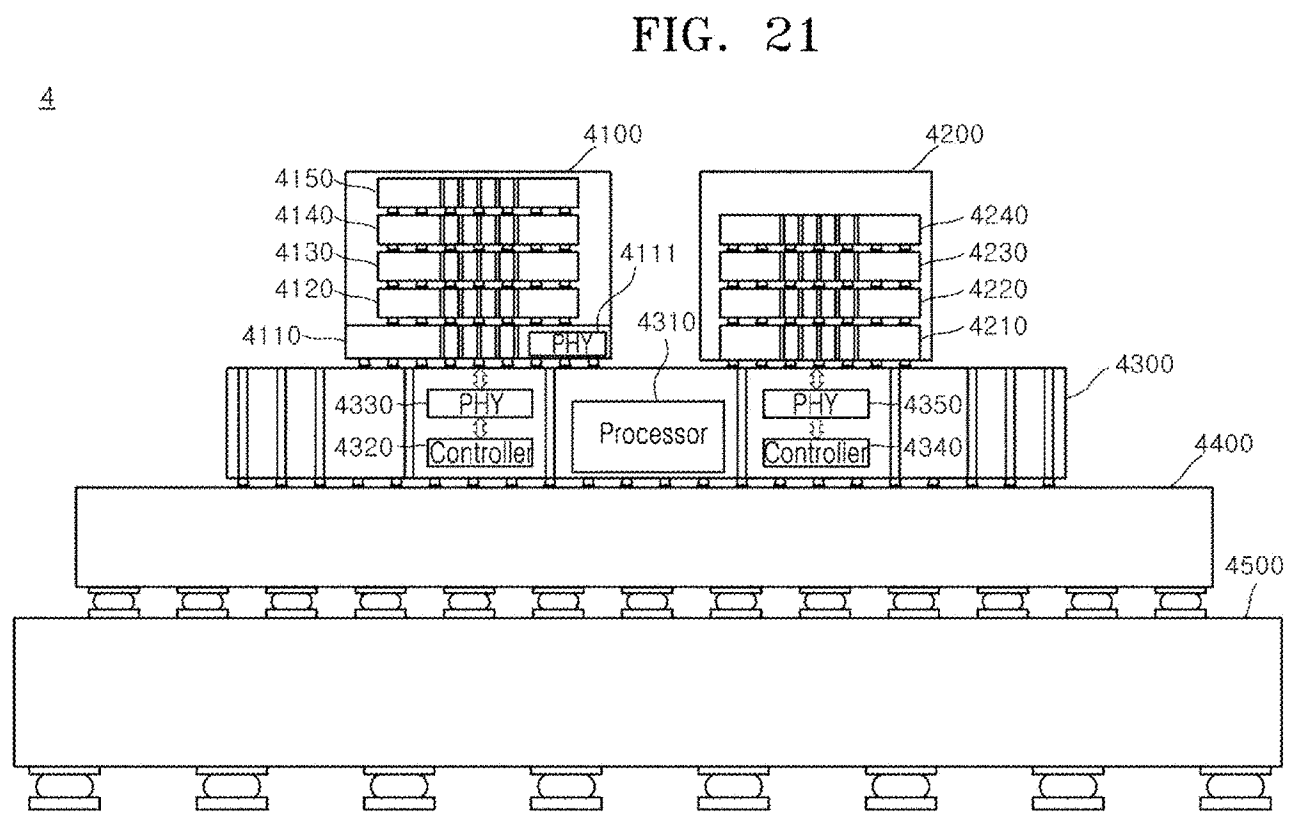

FIG. 21 is a block diagram illustrating a stack memory system 4 according to an embodiment of the present disclosure. As illustrated in FIG. 21, in an embodiment, the stack memory system 4 includes a first stack memory device 4100, a second stack memory device 4200, an interposer 4300, a board 4400, and a main board 4500.

The board 4400 is formed on or over the main board 4500. The interposer 4300 is formed on or over the board 4400. The first stack memory device 4100 and the second stack memory device 4200 are formed on or over the interposer 4300. In an embodiment, the interposer 4300 includes a processor 4310, a first controller 4320, a first process interface circuit (PHY) 4330, a second controller 4340, and a second process interface circuit (PHY) 4350.

The interposer 4300 electrically connects the board 4400, the first stack memory device 4100, the second stack memory device 4200, and the processor 4310. The first stack memory device 4100, the second stack memory device 4200, and the processor 4310 may be electrically connected to the interposer 4400 using wires that are variously formed because a difference between the pitches of the first stack memory device 4100, the second stack memory device 4200, and the processor 4310 is large.

The processor 4310 is electrically connected to the first controller 4320 to control various internal operations of the first stack memory device 4100. The processor 4310 conveys, to the first stack memory device 4100, signals including a command and an address that control various internal operations of the first stack memory device 4100 through the first process interface circuit 4330 and receives signals from the first stack memory device 4100 through the first process interface circuit 4330. The processor 4310 is electrically connected to the second controller 4340 to control various internal operations of the second stack memory device 4200. The processor 4310 conveys, to the second stack memory device 4200, signals including a command and an address that control various internal operations of the second stack memory device 4100 through the second process interface circuit 4350 and receives signals from the second stack memory device 4200 through the second process interface circuit 4350.

In an embodiment, the first stack memory device 4100 includes a first base chip 4110 and first core chips 4120, 4130, 4140, and 4150. The first stack memory device 4100 is implemented similarly to the semiconductor device 1 illustrated in FIG. 1. The first core chips 4120, 4130, 4140, and 4150 are stacked on or over the first base chip 4110 and receive various signals from the first base chip 4110 via through electrodes. The first stack memory device 4100 is formed to include the four first core chips 4120, 4130, 4140, and 4150, although a different quantity of core chips, such as 4, 8, and 16, may be stacked and formed within the first stack memory device 4100 according to an embodiment.

In an embodiment, the first base chip 4110 includes a first core interface circuit (PHY) 4111. The first core interface circuit 4111 communicates with the first processor interface circuit 4330, and receives signals transmitted by the processor 4310 and conveys, to the processor 4310, signals generated by the first core chips 4120, 4130, 4140, and 4150.

In an embodiment, the second stack memory device 4200 includes second core chips 4210, 4220, 4230, and 4240. The second stack memory device 4200 is implemented similarly to the semiconductor device 1 illustrated in FIG. 1. The second core chips 4210, 4220, 4230, and 4240 are stacked and receive various signals via through electrodes. The second stack memory device 4200 is formed to include the four second core chips 4210, 4220, 4230, and 4240, although a different quantity of core chips, such as 4, 8, and 16, may be stacked and formed within the second stack memory device 4200 according to an embodiment.

The second stack memory device 4200 communicates with the second processor interface circuit 4350 and receives signals transmitted by the processor 4310 and conveys, to the processor 4310, signals generated by the second core chips 4210, 4220, 4230, and 4240. The second stack memory device 4200 communicates with the first processor interface circuit 4330 and receives signals transmitted by the first base chip 4110 and conveys, to the processor 4310, signals generated by the second core chips 4210, 4220, 4230, and 4240.

Concepts are disclosed in conjunction with examples and embodiments as described above. Those skilled in the art will understand that various modifications, additions, and substitutions are possible without departing from the scope and technical concepts of the present disclosure. The embodiments disclosed in the present specification should be considered from an illustrative standpoint and not a restrictive standpoint. Therefore, the scope of the present disclosure is not limited to the above descriptions. All changes within the meaning and range of equivalency of the claims are included within their scope.

What is claimed is:

1. A semiconductor device comprising:

a base chip configured to output a strobe signal and a control signal and configured to output a first update signal and a second update signal in response to receiving a first core strobe signal and a second core strobe signal;

a first core chip configured to generate the first core strobe signal by delaying the strobe signal by a first delay amount when a pulse of the control signal is input, configured to output the first core strobe signal to the base chip, and configured to calibrate the first delay amount while the first update signal is enabled; and a second core chip configured to generate the second core strobe signal by delaying the strobe signal by a second delay amount when a pulse of the control signal is input, configured to output the second core strobe signal to the base chip, and configured to calibrate the second delay amount while the second update signal is enabled.

2. The semiconductor device of claim 1, wherein:

the base chip outputs, after a start of a first training operation, the strobe signal and outputs a first pulse of the control signal;

the base chip outputs, after a start of a second training operation, a second pulse of the control signal and generates a comparison signal by comparing a phase of the first core strobe signal and a phase of the second core strobe signal with a phase of a reference strobe signal; and the base chip outputs, after a start of a third training operation, a third pulse of the control signal and generates the first and second update signals based on the comparison signal.

3. The semiconductor device of claim 1, wherein the first core chip is configured to:

generate the first core strobe signal by delaying the strobe signal by the first delay amount based on a first code signal when a first pulse of the control signal is input;

output the first core strobe signal to the base chip when a second pulse of the control signal is input; and increment the first code signal based on the first update signal when a third pulse of the control signal is input.

4. The semiconductor device of claim 1, wherein the second core chip is configured to:

generate the second core strobe signal by delaying the strobe signal by the second delay amount based on a second code signal when a first pulse of the control signal is input;

output the second core strobe signal to the base chip when a second pulse of the control signal is input; and increment the second code signal based on the second update signal when a third pulse of the control signal is input.

5. The semiconductor device of claim 1, wherein the base chip comprises:

a calibration control circuit configured to generate a reference strobe signal and a pulse signal when a test mode signal is enabled, configured to generate a first addition signal and a second addition signal based on a comparison signal, and configured to generate a base transfer control signal and a base reception control signal;

a base input and output circuit configured to output the reference strobe signal as the strobe signal when the base transfer control signal is enabled, configured to output the pulse signal as the control signal, configured to output the first addition signal as the first update signal, configured to output the second addition signal as the second update signal, configured to output the first core strobe signal as a first transfer strobe signal when the base reception control signal is enabled, and configured to output the second core strobe signal as a second transfer strobe signal; and a strobe signal calibration circuit configured to generate the comparison signal by comparing a phase of the first transfer strobe signal and a phase of the second transfer strobe signal with a phase of the reference strobe signal when a calibration enable signal is enabled.

6. The semiconductor device of claim 5, wherein the calibration control circuit comprises:

a counting signal generation circuit configured to generate a counting signal including bits that are sequentially incremented while the test mode signal is enabled;

a control signal generation circuit configured to generate, based on the counting signal, the reference strobe signal that is periodically toggled, the pulse signal comprising a first pulse, a second pulse, and a third pulse, the base transfer control signal, and the base reception control signal; and an addition signal generation circuit configured to generate the first second addition signal and the second addition signal when the comparison signal is enabled.

7. The semiconductor device of claim 5, wherein the strobe signal calibration circuit comprises:

a base delay control circuit configured to delay the first transfer strobe signal and the second transfer strobe signal by a reference delay amount when the calibration enable signal is enabled and configured to output, as a selection strobe signal, one of the first transfer strobe signal and the second transfer strobe signal that are delayed based on a selection signal; and a base comparison circuit configured to generate the comparison signal by comparing a phase of the selection strobe signal with a phase of the reference strobe signal.

8. The semiconductor device of claim 7, wherein the base delay control circuit comprises:

a replica delay circuit configured to generate a first base strobe signal and a second base strobe signal by delaying the first transfer strobe signal and the second transfer strobe signal by the reference delay amount; and a selection transmission circuit configured to output one of the first base strobe signal and the second base strobe signal as the selection strobe signal based on the selection signal when the calibration enable signal is enabled.

9. The semiconductor device of claim 1, wherein the first core chip comprises:

a first core control circuit configured to generate a first core transfer control signal and a first core reception control signal when the pulse of the control signal is input;

a first core input and output circuit configured to output the strobe signal as a first input strobe signal when the first core reception control signal is enabled, configured to output the second core strobe signal as a second input strobe signal, configured to output the first update signal as a first input update signal, and configured to output a first comparison strobe signal as the first core strobe signal when the first core transfer control signal is enabled;

a first core delay control circuit configured to determine the first delay amount based on a first code signal and configured to generate the first comparison strobe signal by delaying the first input strobe signal by the first delay amount when the pulse of the control signal is input; and a first core calibration circuit configured to generate the first code signal by comparing a phase of the first comparison strobe signal with a phase of the second input strobe signal after initializing the first code signal and configured to increment bits of the first code signal while the first input update signal is enabled.

10. The semiconductor device of claim 9, wherein the first core delay control circuit comprises:

a first input code signal generation circuit configured to generate a first input code signal from the first code signal when the pulse of the control signal is input; and a first core delay circuit configured to generate the first comparison strobe signal by delaying the first input strobe signal by the first delay amount based on the first input code signal.

11. The semiconductor device of claim 9, wherein the first core calibration circuit comprises:

a first core comparison circuit configured to generate a first core comparison signal by comparing a phase of the first comparison strobe signal with a phase of the second input strobe signal;

a first internal code signal generation circuit configured to generate a first internal code signal with initialized bits when an initialization signal is enabled and configured to increment bits of the first internal code signal when the first core comparison signal is enabled;

a first addition circuit configured to generate a first addition code signal by incrementing bits of the first internal code signal while the first input update signal is enabled;

a first output control signal generation circuit configured to generate a first output control signal that is disabled when the initialization signal is enabled and that is enabled when the pulse of the control signal is input and while the first input update signal is enabled; and a first selection transmission circuit configured to output the first internal code signal as the first code signal when the first output control signal is disabled and configured to output the first addition code signal as the first code signal when the first output control signal is enabled.

12. The semiconductor device of claim 1, wherein the second core chip comprises:

a second core control circuit configured to generate a second core transfer control signal and a second core reception control signal when the pulse of the control signal is input;

a second core input and output circuit configured to output the strobe signal as a third input strobe signal, output the first core strobe signal as a fourth input strobe signal, and output the second update signal as a second input update signal when the second core reception control signal is enabled and configured to output a second comparison strobe signal as the second core strobe signal when the second core transfer control signal is enabled;

a second core delay control circuit configured to set the second delay amount based on a second code signal and configured to generate the second comparison strobe signal by delaying the third input strobe signal by the second delay amount when the pulse of the control signal is input; and a second core calibration circuit configured to generate the second code signal by comparing a phase of the second comparison strobe signal with a phase of the fourth input strobe signal after initializing the second code signal and configured to increment bits of the second code signal while the second input update signal is enabled.

13. The semiconductor device of claim 12, wherein the second core delay control circuit comprises:

a second input code signal generation circuit configured to generate a second input code signal from the second code signal when the pulse of the control signal is input; and a second core delay circuit configured to generate the second comparison strobe signal by delaying the third input strobe signal by the second delay amount based on the second input code signal.

14. The semiconductor device of claim 12, wherein the second core calibration circuit comprises:

a second core comparison circuit configured to generate a second core comparison signal by comparing a phase of the second comparison strobe signal with a phase of the fourth input strobe signal;

a second internal code signal generation circuit configured to generate a second internal code signal with initialized bits when an initialization signal is enabled and configured to increment bits of the second internal code signal when the second core comparison signal is enabled;

a second addition circuit configured to generate a second addition code signal by incrementing bits of the second internal code signal while the second input update signal is enabled;

a second output control signal generation circuit configured to generate a second output control signal that is disabled when the initialization signal is enabled and that is enabled when the pulse of the control signal is input and while the second input update signal is enabled; and a second selection transmission circuit configured to output the second internal code signal as the second code signal when the second output control signal is disabled and configured to output the second addition code signal as the second code signal when the second output control signal is enabled.

15. A semiconductor device comprising:

a base chip configured to output a strobe signal and a control signal and configured to output an update signal in response to detecting a phase of a core strobe signal; and a core chip configured to generate the core strobe signal by delaying the strobe signal by a delay amount based on a code signal when a first pulse of the control signal is enabled, configured to output the core strobe signal to the base chip when a second pulse of the control signal is enabled, and configured to calibrate the delay amount by incrementing bits of the code signal when a third pulse of the control signal and the update signal are enabled.

16. The semiconductor device of claim 15, wherein the update signal is enabled when a phase of the core strobe signal is different from a phase of a reference strobe signal generated based on the strobe signal.

17. The semiconductor device of claim 15, wherein core chip calibrates the delay amount by incrementing bits of the code signal while the update signal is enabled after initializing the code signal.

18. The semiconductor device of claim 15, wherein the base chip comprises:

a calibration control circuit configured to generate a reference strobe signal and a pulse signal, generate an addition signal based on a comparison signal, and generate a base transfer control signal and a base reception control signal when a test mode signal is enabled;

a base input and output circuit configured to output the reference strobe signal as the strobe signal, output the pulse signal as the control signal, and output the addition signal as the update signal when the base transfer control signal is enabled, and configured to output the core strobe signal as a transfer strobe signal when the base reception control signal is enabled; and a strobe signal calibration circuit configured to generate the comparison signal by comparing a phase of the transfer strobe signal with a phase of the reference strobe signal when a calibration enable signal is enabled.

19. The semiconductor device of claim 18, wherein the calibration control circuit comprises:

a counting signal generation circuit configured to generate a counting signal including bits that are sequentially incremented when the test mode signal is enabled;

a control signal generation circuit configured to generate, based on the counting signal, the reference strobe signal that is periodically toggled, the pulse signal comprising the first pulse, the second pulse, and the third pulse, the base transfer control signal, and the base reception control signal; and an addition signal generation circuit configured to generate the addition signal when the comparison signal is enabled.

20. The semiconductor device of claim 18, wherein the strobe signal calibration circuit comprises:

a base delay control circuit configured to delay the transfer strobe signal by a reference delay amount when the calibration enable signal is enabled and configured to output the transfer strobe signal that is delayed as a selection strobe signal based on a selection signal; and a base comparison circuit configured to generate the comparison signal by comparing a phase of the selection strobe signal with a phase of the reference strobe signal.

21. The semiconductor device of claim 20, wherein the base delay control circuit comprises:

a replica delay circuit configured to generate a base strobe signal by delaying the transfer strobe signal by the reference delay amount; and a selection transmission circuit configured to output a base strobe signal as the selection strobe signal based on the selection signal when the calibration enable signal is enabled.

22. The semiconductor device of claim 15, wherein the core chip comprises:

a core control circuit configured to generate a core transfer control signal and a core reception control signal when the pulse of the control signal is input;

a core input and output circuit configured to output the strobe signal as an input strobe signal and output the update signal as an input update signal when the core reception control signal is enabled and configured to output a comparison strobe signal as the core strobe signal when the core transfer control signal is enabled;

a core delay control circuit configured to set the delay amount based on the code signal and configured to generate the comparison strobe signal by delaying the input strobe signal by the delay amount when the pulse of the control signal is input; and a core calibration circuit configured to generate the code signal by comparing a phase of the comparison strobe signal with a phase of an input strobe signal received from outside the semiconductor device after initializing the code signal and configured to increment bits of the code signal while the input update signal is enabled.

23. The semiconductor device of claim 22, wherein the core delay control circuit comprises:

an input code signal generation circuit configured to generate an input code signal from the code signal when the pulse of the control signal is input; and a core delay circuit configured to generate the comparison strobe signal by delaying the input strobe signal by the delay amount based on the input code signal.

24. The semiconductor device of claim 22, wherein the core calibration circuit comprises:

a core comparison circuit configured to generate a core comparison signal by comparing a phase of the comparison strobe signal with a phase of the input strobe signal;

an internal code signal generation circuit configured to generate an internal code signal with initialized bits when an initialization signal is enabled and configured to increment bits of the internal code signal when the core comparison signal is enabled;

an addition circuit configured to generate an addition code signal by incrementing bits of the internal code signal while the input update signal is enabled;

an output control signal generation circuit configured to generate an output control signal disabled when the initialization signal is enabled and enabled when the pulse of the control signal is input and while the input update signal is enabled; and a selection transmission circuit configured to output the internal code signal as the code signal when the output control signal is disabled and configured to output the addition code signal as the code signal when the output control signal is enabled.

25. A strobe signal training method comprising:

initializing a code signal of a core chip after a start of a first training operation;

outputting, by a base chip, a strobe signal and a control signal after the start of the first training operation;

outputting, by the core chip after a start of a second training operation, a core strobe signal generated by delaying the strobe signal by a delay amount based on the code signal to the base chip and generating, by the base chip, an update signal by comparing a phase of the core strobe signal with a phase of a reference strobe signal generated from the strobe signal; and outputting, by the base chip after a start of a third training operation, the update signal to the core chip and calibrating, by the core chip, the delay amount by incrementing bits of the code signal while the update signal is enabled.

26. The strobe signal training method of claim 25, wherein the first to third training operations are sequentially performed to adjust alignment of the strobe signal.

27. The strobe signal training method of claim 25, wherein:

the base chip outputs the strobe signal and a first pulse of the control signal after the start of the first training operation, the base chip outputs, after the start of the second training operation, a second pulse of the control signal and generates a comparison signal by comparing a phase of the core strobe signal with a phase of the reference strobe signal, and the base chip outputs a third pulse of the control signal and generates the update signal based on the comparison signal, after the start of the third training operation.

28. The strobe signal training method of claim 25, wherein the core chip:

generates the core strobe signal by delaying the strobe signal by the delay amount based on the code signal when a first pulse of the control signal is input;

outputs the core strobe signal to the base chip when a second pulse of the control signal is input; and increment bits of the code signal based on the update signal when a third pulse of the control signal is input.

29. The strobe signal training method of claim 25, wherein after the start of the first training operation, the core chip initializes bits included in the code signal at a first logic level.

30. The strobe signal training method of claim 29, wherein after the start of the second training operation, the core chip sequentially increments the bits of the code signal.

31. The strobe signal training method of claim 30, wherein the third training operation includes incrementing the bits of the code signal until each combination of the bits of the code signal is incremented.

32. The strobe signal training method of claim 30, wherein during the third training operation, the core chip stores the code signal when the update signal is disabled.

* * * * *